United States Patent
Donaldson et al.

(10) Patent No.: US 7,509,647 B2
(45) Date of Patent: Mar. 24, 2009

(54) METHOD AND APPARATUS FOR MODELING DATAFLOW SYSTEMS AND REALIZATION TO HARDWARE

(75) Inventors: Robert L. Donaldson, Annapolis, MD (US); Rhett D. Hudson, Columbia, MD (US); Lawrence M. Marshall, Jr., Upper Marlboro, MD (US); Michael N. Gray, Annapolis, MD (US); James J. Sullivan, Annapolis, MD (US); James B. Peterson, Crofton, MD (US); Teresa G. Smith, Leesburg, VA (US); Michael P. Klewin, Annapolis, MD (US); Dennis M. Hawver, Annapolis, MD (US)

(73) Assignee: Annapolis Micro Systems, Inc., Annapolis, MD (US)

( * ) Notice: Subject to any disclaimer, the term of this patent is extended or adjusted under 35 U.S.C. 154(b) by 661 days.

(21) Appl. No.: 10/152,634

(22) Filed: May 23, 2002

(65) Prior Publication Data

US 2002/0178285 A1    Nov. 28, 2002

Related U.S. Application Data

(60) Provisional application No. 60/293,158, filed on May 25, 2001.

(51) Int. Cl.
*G06F 9/46* (2006.01)
*G06F 17/50* (2006.01)
*G06F 15/16* (2006.01)

(52) U.S. Cl. .................... 718/106; 703/14; 709/237

(58) Field of Classification Search .............. 718/100, 718/102, 107, 106; 716/1; 703/13, 14, 15, 703/22, 204; 717/105; 719/316; 709/217, 709/237

See application file for complete search history.

(56) References Cited

U.S. PATENT DOCUMENTS

| | | | | |
|---|---|---|---|---|
| 4,418,383 A | * | 11/1983 | Doyle et al. | 710/307 |
| 5,021,947 A | * | 6/1991 | Campbell et al. | 712/25 |
| 5,455,928 A | | 10/1995 | Herlitz | |
| 5,842,045 A | * | 11/1998 | Nakamura | 710/63 |
| 5,852,449 A | | 12/1998 | Esslinger et al. | |
| 5,870,588 A | * | 2/1999 | Rompaey et al. | 703/13 |
| 5,872,810 A | | 2/1999 | Philips et al. | |
| 5,911,776 A | * | 6/1999 | Guck | 709/217 |
| 5,978,574 A | | 11/1999 | Sharma | |
| 6,044,211 A | * | 3/2000 | Jain | 716/18 |
| 6,182,024 B1 | | 1/2001 | Gangopadhyay et al. | |
| 6,233,540 B1 | | 5/2001 | Schaumont et al. | |
| 6,272,451 B1 | * | 8/2001 | Mason et al. | 703/13 |
| 6,356,796 B1 | | 3/2002 | Spruiell et al. | |
| 6,393,515 B1 | * | 5/2002 | Pollack et al. | 711/108 |
| 6,421,808 B1 | * | 7/2002 | McGeer et al. | 716/1 |

* cited by examiner

*Primary Examiner*—Meng-Ai An
*Assistant Examiner*—Camquy Truong
(74) *Attorney, Agent, or Firm*—Foley & Lardner LLP

(57) ABSTRACT

In hardware, performing computations on a stream typically requires handshaking signals to provide flow control. Many different handshaking protocols are available, and they are typically implemented in an ad hoc manner suited to the current design. An approach according to the invention uses a subset of the possible flow-control protocols in an effort to achieve a maximum amount of flexibility and reusability, while requiring only a moderate level of overhead when compared to manually-designed systems.

71 Claims, 27 Drawing Sheets

VDR$_n$ Signals:                                            PDR$_n$ Signals:

○ - Logical AND $\delta^n$ - Delay by "n" Clock Cycles

VDL$_0$ Signals:                                           VDR$_{-n}$ Signals:

○ - Logical AND $\delta^n$ - Delay by "n" Clock Cycles

"Serve" Operator:

- "Auto-Route" Component

- "Merge" Component

- Computational Servers

- "Clear-Skew" Operator

"Group" Operator:

"Ungroup" Operator:

- Logical AND

METHOD AND APPARATUS FOR MODELING DATAFLOW SYSTEMS AND REALIZATION TO HARDWARE

FIELD OF THE INVENTION

The invention relates to apparatus and methods for modeling dataflow within systems and circuits and to realizing such systems and circuits in hardware.

BACKGROUND OF THE INVENTION

Conventional circuit capture and simulation schemes are limited in their abilities to scale designs and are typically restricted by their fixed port maps, with a specific number of ports having specific names and types. Such approaches require that all input ports be connected in some functionally correct manner and do not provide the option of dynamic ports wherein the ports and their characteristics can adapt to system requirements. Moreover, conventional schematic capture schemes provide libraries of components with fixed parameters. As a result, designs of products, such as field programmable gate arrays and other custom circuits are constrained to a narrow range of implementations and cannot be optimized based on the dataflow in the system. In addition, such design systems typically comprise low-level components whose interaction with peer components must be manually negotiated by the user.

A system according to the invention seeks to avoid such limitations by providing a designer the ability to create designs based on dataflow, as represented in components responsive to well defined intercommunication protocols. A system according to the invention conceptually behaves in a manner analogous to that of a Petri Net. According to the invention, protocols are derivative of several canonical forms. According to the invention, these canonical forms also directly imply a second tier of protocols that convert a data stream compliant to one canonical protocol to any of the other canonical protocols. A system according to the invention allows the development of multiple dataflow streams by interconnecting components compliant with one or more of the canonical forms either directly, for components compliant to the same intercommunication protocol, or through the canonical conversions, for components whose intercommunication protocols differ.

Further, the invention provides a mapping between a modeled system and various hardware implementations of the modeled system. This mapping includes low-level hardware for implementing the canonical intercommunication protocols and the canonical conversions between protocols. Target hardware platforms include but are not limited to microprocessor-based systems, programmable logic devices, field programmable gate arrays and application specific integrated circuits.

In another aspect of the invention, consistent with a dataflow approach, a design can be modeled with components having non-static port maps, so that components can derive their parameters, such as bit width, based on the their interconnections with other components. Glue logic, such as that required for the convergence of ready signals can be automatically implied. Moreover, a design targeted to a specific hardware platform can be re-targeted to a different hardware platform by changing the binding of data sources and sinks, making designs re-useable among a plurality of platforms.

BRIEF DESCRIPTION OF THE DRAWINGS

A method and apparatus according to the invention are disclosed herein with reference to the drawings in which.

DESCRIPTION OF THE PREFERRED EMBODIMENTS

A method of modeling a dataflow architecture according to the invention includes storing in a memory indicia which represent a dataflow architecture having components responsive to intercommunication protocols and processing conversions among the intercommunication protocols to determine control structures required to implement the dataflow architecture. The indicia stored in memory and the control structures are translated into a description of an implementation of the dataflow architecture. The description of an implementation may be in a standard format for defining a network format such as the electronic design interchange format (EDIF) netlisting language, or a hardware description language such as structural very highscale integrated circuit description language (VHDL), or structural Verilog. The description of an implementation is further translated into a physical implementation of the dataflow architecture. The physical implementation may be configuration data for a field programmable gate array (FPGA). The physical implementation may be a layout for an application specific integrated circuit (ASIC). The physical implementation is object code for a general-purpose processor.

Dataflow Protocols

Figure 1:
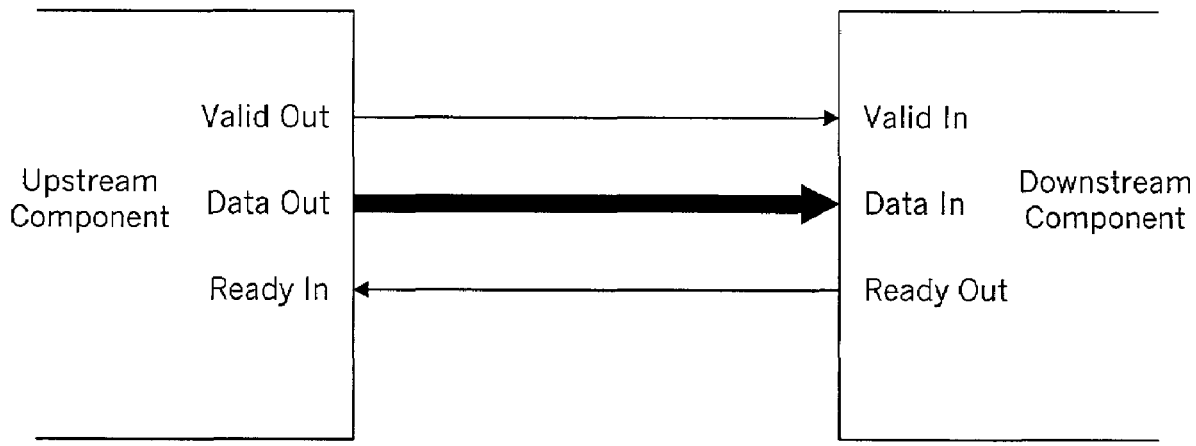
FIG. 1 illustrates a simple dataflow path between two components.

In addition to data signals, virtually all dataflow paths also require at least one forward-flowing handshake bit and one backward-flowing handshake bit. Protocols requiring less than this typically have the missing information implied as a property of the design. For instance, a pipelined computational component may be always ready to accept inputs, thus obviating the need for a "ready" signal indicating that it is able to accept inputs. These two handshake signals will always accompany data paths in order to provide full control, and appear herein as shown in FIG. 1. The set of protocols herein are those which transfer data between two hardware-level dataflow components (DFCs), and will be referred to throughout as the set of DFC protocols. Also presented herein are a collection of simple transformations between the DFC protocols, and example implementations of computational units.

The forward-flowing handshake and data signals, as well as the backward-flowing handshake signal may be thought of as a single bus, much the same way that a multiple-bit data value is considered to be a single bus, with the exception that the directionality of the backward-flowing handshake signal is always contrary to the nominal flow of the bus. This contrary flow becomes a source of complexity when attempting seemingly trivial operations such as fanning out a signal, as will be discussed later.

The DFC protocol shown in use in FIG. 1 is one of the full flow control protocols presented here. This protocol, named "VDR" after the first letters of the "valid", "data", and "ready" signals, is unrestricted in terms of when each of its handshake signals may be asserted. The only rule is that, if both "valid" and "ready" are asserted during the same clock period, the data presented on the "data" signal will be passed on from the upstream component to the downstream component. This transfer may not be undone, and the downstream component is then free to do as it sees fit with the data it receives.

Figure 2:
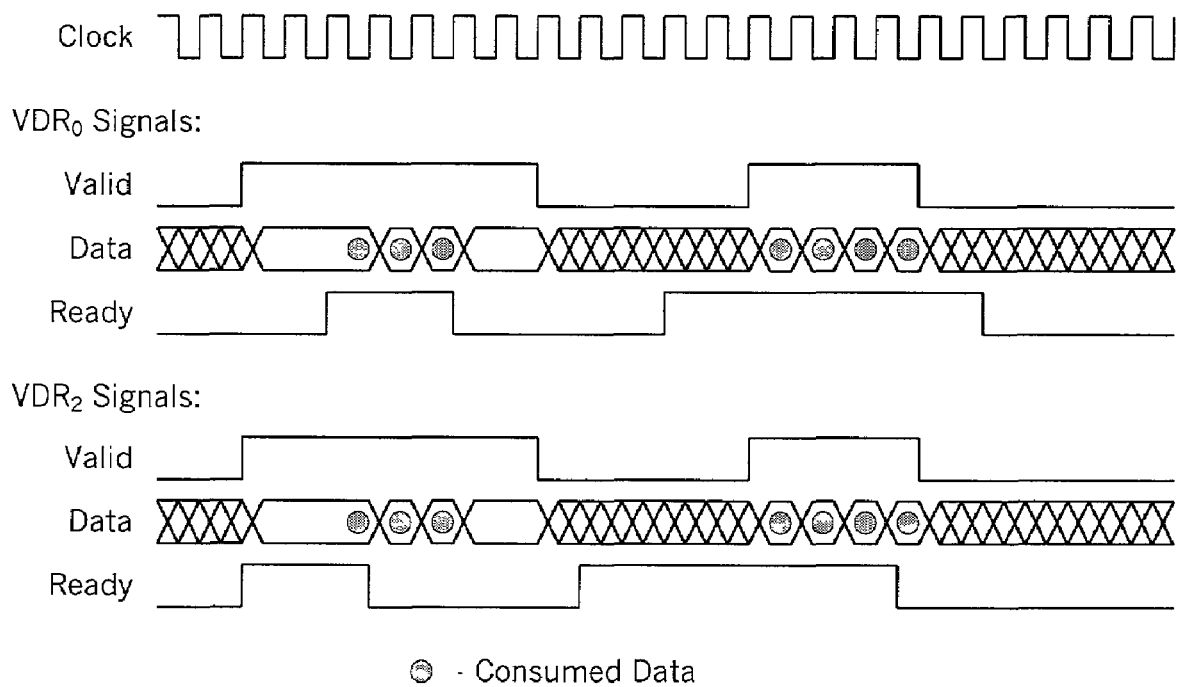
FIG. 2 illustrates an example of $VDR_O$ and $VDR_2$ Signals

Due to timing restrictions, there may be occasions where the forward-flowing "valid" and "data" signals might be temporally skewed with respect to the backward-flowing "ready" signal. For more complex circuits, this becomes a highly useful aspect of the DFC protocols, and is referred to herein as the skew associated with the DFC bus. The skew is defined as the number of clock cycles of delay between when a component asserts its "ready" line (or whatever the backward-flowing handshake signal may be called) and when the data to be consumed is present on the "data" signal. This skew is almost always non-negative, since accurately presenting valid data while having to predict whether or not it will be consumed is typically prohibitively complex, if not impossible, and is usually not of much use. The skew is presented herein as a sub-scripted number to the left of the "VDR" name. The intuitive protocol described in the previous paragraph and shown in FIG. 1 is thus denoted as "$VDR_0$". Another parameter could reflect the delay between the "data" signal and the associated "valid" signal, but in most protocols this parameter is always 0, and allowing for it to be non-zero is of little use, so this option can generally be ignored. An example timing diagram for both a $VDR_0$ and $VDR_2$ data bus is shown in FIG. 2.

Figure 3:
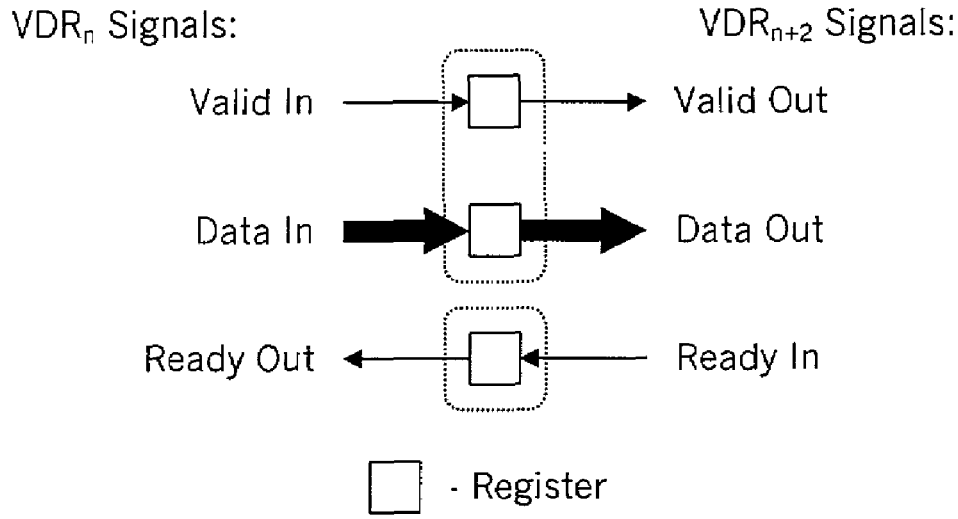
FIG. 3 illustrates adding skew to a $VDR_n$ signal

Skew may be incurred through the use of registers on all inputs and outputs of a component when strict timing constraints are required, such as with high-performance computations in a field programmable gate array (FPGA). Registering all three signals in a $VDR_n$ bus will add 2 to the skew, transforming it into a $VDR_{n+2}$ bus protocol, as shown in FIG. 3. The figure actually consists of two distinct components (shown by the dotted lines), each of which adds a skew of 1. The registers on the forward-flowing signals are one such component, and the registers on the backward-flowing signal is the other. Because we've assumed that the "valid" and "data" signals are not skewed with respect to each other in the VDR protocol, it is useful not to violate this assumption by registering one without registering the other.

Figure 4:
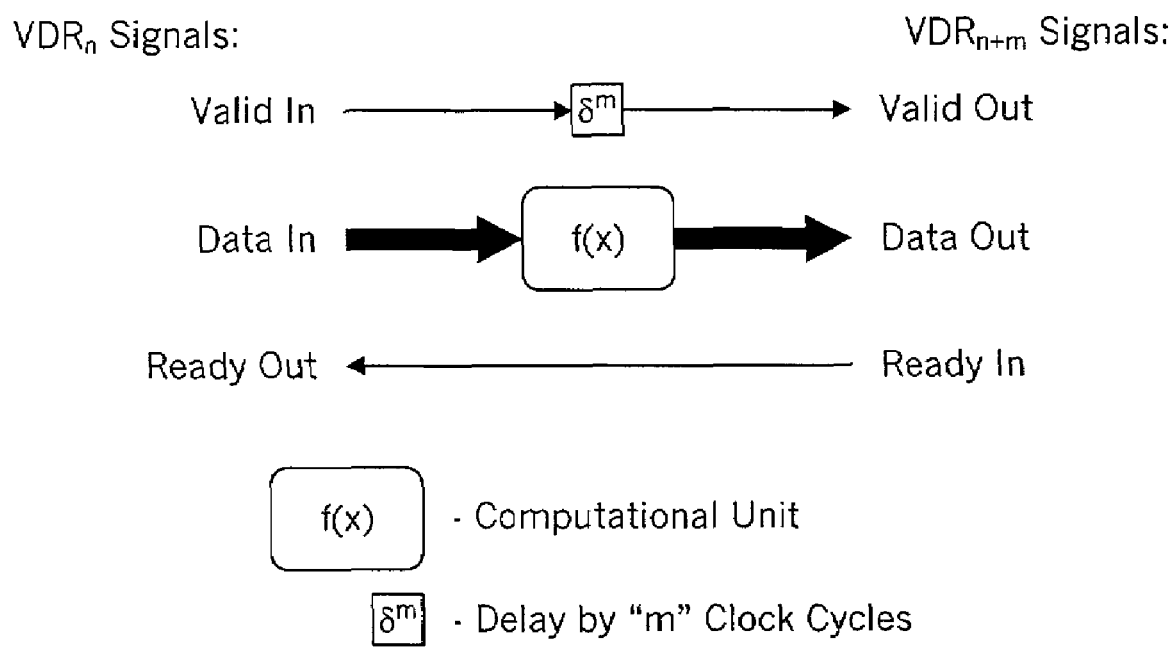
FIG. 4 illustrates a pipelined computational unit.

A manipulation of the data stream which requires pipelining to meet timing constraints can also add skew to a VDR bus. FIG. 4 shows an example of a pipelined operator which performs some computation on its $VDR_n$ input data, and generates a $VDR_{n+m}$ output, where "m" is the latency of the computational pipeline. Note that, since we require that "valid" and "data" remain synchronized with one another, we must delay the "valid" signal by the same delay imposed upon the "data" signal during the computation. We need not delay the "ready" signal, doing so would simply add to the skew.

Figure 5:
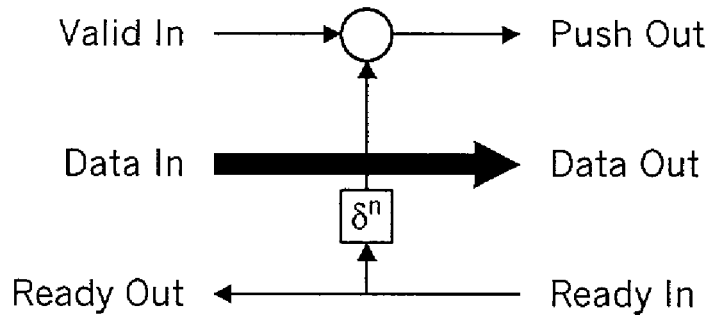
FIG. 5 illustrates an example "Push-Cast" Operator

Because data is only considered to be transferred from a VDR output to a VDR input when both the "valid" and the "ready" flow-control signals are asserted, one of the first things that a component accepting a VDR input would typically do is perform a logical AND operation on these two signals to generate a signal indicating that the currently incoming data is to be consumed. Since this signal would most often used to push values into a FIFO, it is called the "push" signal. Creating a "push" signal from a "valid" and "ready" signal is known herein as a "push-cast" operation. Due to the potential for skew between the "ready" and "data" signals (and hence, between "ready" and "valid" signals), a "push-cast" operation is not only an AND gate, but also a delay chain used to synchronize the "ready" and "valid" signals. FIG. 5 shows an implementation of a "push-cast" operator. Because the delay component reduces to a wire at skew 0, "push-cast" operators may appear before any skew is ever added to a VDR bus.

This "push-cast" operation converts a $VDR_n$ signal to another DFC protocol referred to herein as "PDR". The name of this protocol is derived from the first letters of its three signals: "push", "data", and "ready". The PDR protocol also has an associated skew, and the "push-cast" operation maintains this skew, converting a $VDR_n$ signal into a $PDR_n$ signal. The major rules of the PDR protocol are that data presented with an asserted "push" must be consumed, and that "push" may not be asserted when the associated "ready" signal is not (note that, due to potential skew, the "push" signal and its associated "ready" signal may not necessarily occur during the same clock cycle).

Similarly, some components may only wish to assert their intent to consume incoming data during certain times when they are guaranteed that the incoming data will be consumable. These components AND the incoming "valid" signal with their internally-computed "ready" signal, and present the resulting signal as their backward-flowing handshake output. Since this signal may be used to pull data from a FIFO, it is referred to as the "pull" signal. Creating a "pull" signal from a "valid" and "ready" signal is known as a "pull-cast" operation, and since the result of the AND operation is temporally aligned with the "valid" signal, the resulting protocol has a skew of 0, and the "pull-cast" operation is usually only performed on $VDR_0$ busses.

The "pull-cast" operation implies a third DFC protocol referenced herein as "VDL". The third letter of "pull" is used to name this protocol in order to avoid the confusion of using the same letter to denote both "push" and "pull". The major rules of the VDL protocol are that "pull" can only be asserted when "valid" is asserted, and the data associated with an assertion of "pull" will be consumed.

Figure 6:
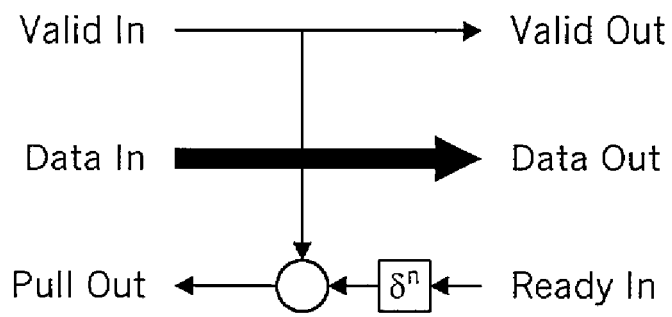
FIG. 6 illustrates an example "Pull-Cast" Operator

FIG. 6 shows an example of a "pull-cast" operator. The right-hand side of the diagram refers to a $VDR_{-n}$ bus. Since negative skews are unwieldy, the value of "n" is usually 0 during a "pull-cast" operation. A bus using the VDL protocol can not function with a skew greater than zero, since it can never assert "pull" without knowing if "valid" will be asserted in the future. Because of the contrary flow of the "ready"/"pull" signals, the "pull-cast" actually appears to be converting a $VDL_0$ signal into a $VDR_0$ signal. However, the "pull-cast" may be thought of as an adapter which is attached before the input of a unit.

Figure 7:
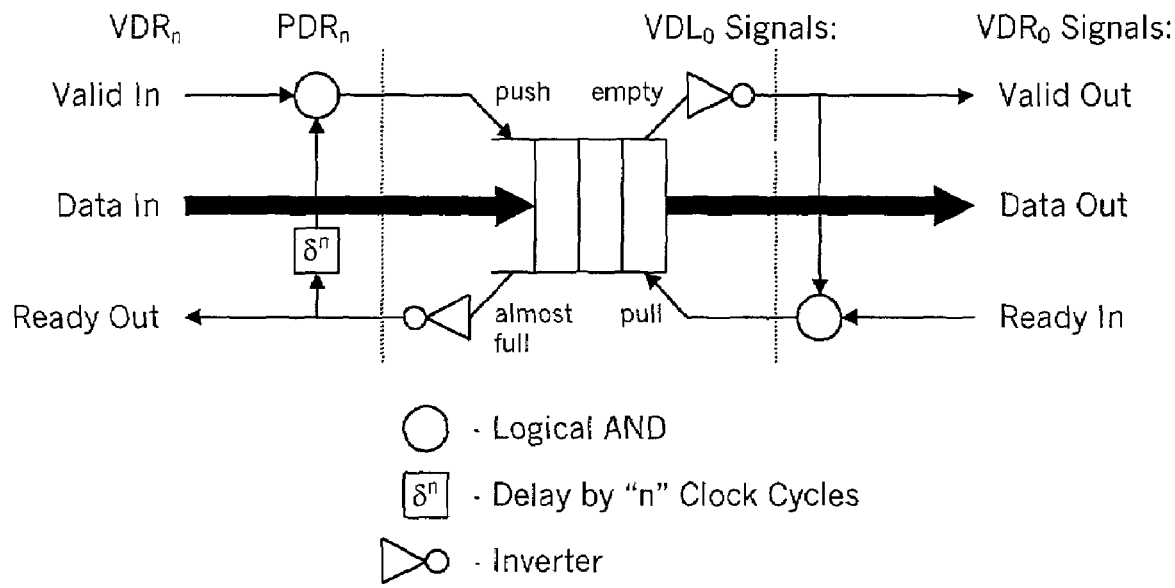
FIG. 7 illustrates an example "Clear-Skew" Operator

During manipulations of DFC busses, skew tends to accumulate. Many simple components can add to the skew of a DFC bus but few can subtract from this skew. However, at times, it is required that the skew on a particular bus be 0. Reducing the skew to 0 can be achieved using a "clear-skew" operation. To clear a skew of "n", the operation must drop its "ready" output when it can only accept "n" more data values. These data values are queued up in a First in First out device (FIFO) and presented to the downstream port as required. The "clear-skew" operator is thus a data FIFO, with an "almost full" control signal which is set to be asserted when there are "n" or fewer spaces left in the FIFO. Incoming data, if it uses the VDR protocol, may be cast to PDR using a "push-cast", and the resulting $VDL_0$ output may be converted to $VDR_0$. FIG. 7 shows an example of a "clear-skew" operation. The number of spaces left for which the FIFO's "almost full" signal is asserted will be referred to hereafter as the "reserve" of the FIFO or the "reserve" of the "clear-skew", and it should be set to the skew of the incoming PDR signals.

DFC Protocol Rules

The "valid", "push", "data", "ready", and "pull" signal definitions, along with the associated definition of the skew parameter, are the elements which make up the VDR, PDR, and VDL protocols. It is within the scope of the invention to employ a dual set of protocols which use "empty" as an inverted-sense replacement for "valid", and "full" as the inverted-sense replacement for "ready". The resulting protocols (EDF, PDF, and EDL) would then exactly match the correspondingly-named signals on a typical FIFO element. Since there is no benefit inherent in choosing one set of protocols over the other, we acknowledge the existence of the dual set here as within the scope of the invention, and recognize that the "valid" and "ready" signals may be generated from the "not empty" and "not full" control signals of a FIFO. The formal definitions of the various DFC signals are as follows:

valid: active-high signal asserting that data presented on the "data" signal is valid
push: active-high signal asserting that data presented on the "data" signal must be consumed
data: the actual data to consume
ready: active-high signal asserting that the component is willing to consume data
pull: active-high signal asserting that the component is consuming the data The rules associated with these signals ensure that no data is lost or fabricated within a computational structure. The rules are as follows:

1. Data presented on the "data" signal may be delayed a fixed number of clock cycles with respect to its associated "ready" or "pull" signal. The amount of this delay is referred to as the "skew" associated with the bus, and is typically non-negative.
2. The skew associated with the inputs and outputs of a component, and the skew added to a data stream by a computational component must be a static property of the component.
3. Data presented on the "data" signal should not be delayed with respect to its associated "valid" or "push" signal. While such a delay would not be intractable, it is usually of no use, and so it is not given a name and is assumed to be 0.
4. Data is "consumed", transferred from the upstream component to the downstream component, when a) both "valid" and the associated "ready" are asserted, or b) "push" or "pull" is asserted. These two conditions must be logically equivalent. The consumption of data can not be undone.
5. The "push" signal should not be asserted when the associated "ready" signal is not asserted.
6. The "pull" signal should not be asserted when the associated "valid" signal is not asserted.

It seems at first glance that a $PDR_n$ output could be made to drive a $VDR_n$ input simply by hooking the "push" output to the "valid" input. After all, the additional restriction that the "push"/"valid" line will not be asserted during a time when the "ready" line is not asserted does not appear to violate the looser VDR protocol, which allows "valid" to be high at any time. Similarly, it appears that a $VDR_n$ output could easily drive a $VDL_n$ input. To avoid deadlocking data streams, however, it is useful to realize precisely which protocol is being used. If a component with a VDR output will only assert "valid" when it sees an asserted "ready" signal, that component is better described as having a PDR output. And again, a VDR input which is only ready when valid data is available is really a VDL input.

This distinction becomes important when considering a fourth DFC protocol called "PDL", which has "push", "data", and "pull" signals. This protocol is subject to the complication of deadlock. Extrapolating the rules of the PDR and VDL protocols, one major rule of PDL is that the "push" and associated "pull" signals must either be both asserted or both deasserted. Because the upstream component may not have valid data to present, the downstream component is not able to assume that it can assert its "pull" output. Similarly, since the downstream component may not be able to accept valid data, the upstream component could not presume to be able to assert "push". The only functional form of a bus using the PDL protocol is the degenerate case where a component is known to either always be ready or always have valid data to present. This is really more like cheating the protocol, though, since that known property of the component is a form of a "virtual" handshake signal, whose value is always known and is factored into the design of the interfacing component.

Figure 8:
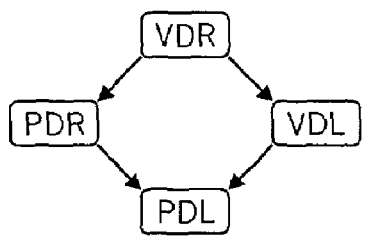
FIG. 8 illustrates a connected-protocol relational graph

The importance of this PDL protocol becomes more obvious when it is used to help describe what really happens when a DFC stream is misclassified, and subsequently hooked up to a component which implements the protocol with which the stream is labeled. FIG. 8 shows a relational graph which describes what happens when two DFC protocols are directly connected. The nodes of the graph represent the DFC protocols shown. When two DFC protocols are directly connected, the resulting protocol which governs the connection is the highest node which can be reached from both of the connected protocols by following the arrows. Thus, if a PDR and VDR port are connected, the PDR protocol will govern the connection. Note, however, that if a PDR and VDL port are connected, the PDL protocol will govern the connection, and data transfer will deadlock. Thus, if a component is described as having a VDR output, even though it really implements a PDR protocol, and the user wishes to connect it to a VDL input, he may attempt to connect it directly, expecting the VDL protocol to govern the connection, but the system will deadlock.

Therefore, in general, it is useful to precisely describe the protocol supported by a designed component. It should be noted, though, that the same collection of logic and registers may just happen to implement two different DFC protocols.

Multiple DFC Streams

Until now, all examples herein have used only a single input stream and a single output stream. In useful computations, it is rarely the case that the implementation consists entirely of such components. Handling multiple DFC streams is more complicated than the analog of handling multiple "once-per-clock-cycle" raw data streams. Even the simple act of fanning out a DFC component's output is more complex than just routing it to two destinations, due in part to the fact that the backward-flowing "ready" or "pull" signal would then have multiple drivers. Two of the most common manipulations on DFC streams that require attention, besides those already described, are the "fan-out" operation and the "synchronize" operation.

Figure 9:
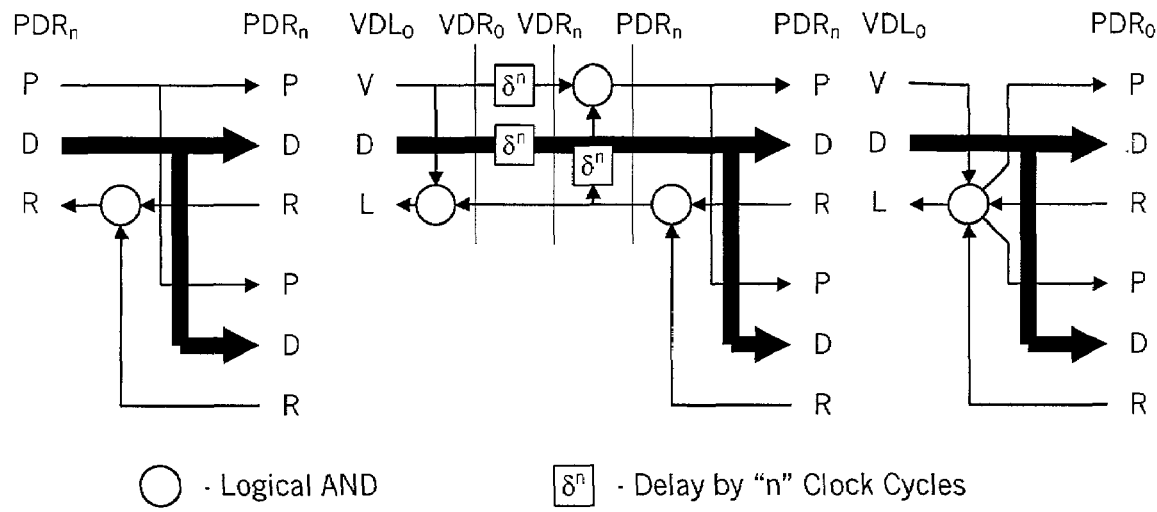
FIG. 9 illustrates a three example "Fan-Out" Operator

A "fan-out" operator can not route the "valid" signal directly to both destinations, since one destination may consume the data before the other is ready to do so. This may lead to dropping or replicating data if not compensated for with additional hardware. A simple form of a "fan-out" operator is a single multiple-input AND gate, and takes a PDR input and provides PDR outputs. This operator is shown in the left diagram of FIG. 9. Given this operator, it is easy to conceive of attaching various transformations onto the front of the input to allow it to accept $VDL_0$ or $VDR_n$ inputs. The results of this process are presented as the middle diagram of FIG. 9. A simplification of this structure for the case where the "fan-out" operator takes a single $VDL_0$ input and presents it as multiple $PDR_0$ outputs is shown as the right diagram of FIG. 9.

Figure 10:
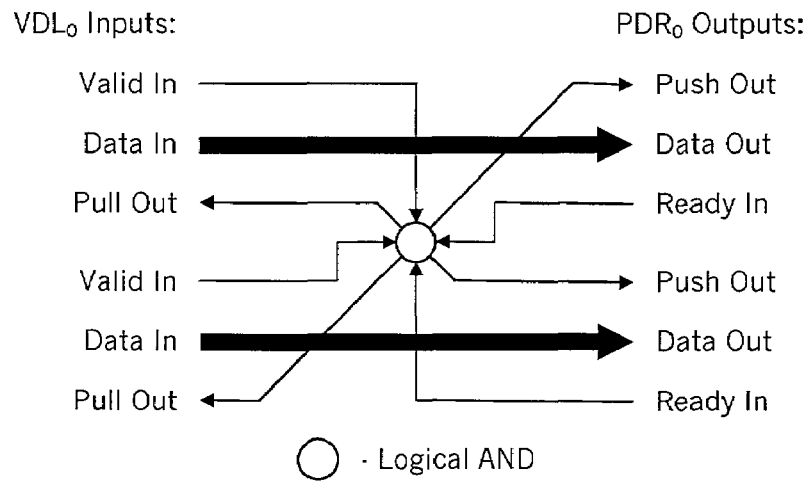
FIG. 10 illustrates an example "Synchronize" Operator

A "synchronize" operator has restrictions similar to the version of the "fan-out" operator which takes a $VDL_0$ input. The only difference being that, since it has multiple inputs, multiple "valid" signals are fed into the AND gate to generate the "push"/"pull" signal for all inputs and outputs. In fact, both the $VDL_0$ version of the "fan-out" operator and the "synchronize" operator can be viewed as special variations on a more general operator which routes its input data to its output ports in whatever form is desired, performs a logical AND on all of the "valid" and "ready" signals, and uses the result for all of the "push" and "pull" signals. FIG. 10 shows an example "synchronize" operator. It is similar to the $VDL_0$ version of the "fan-out" operator.

Figure 11:
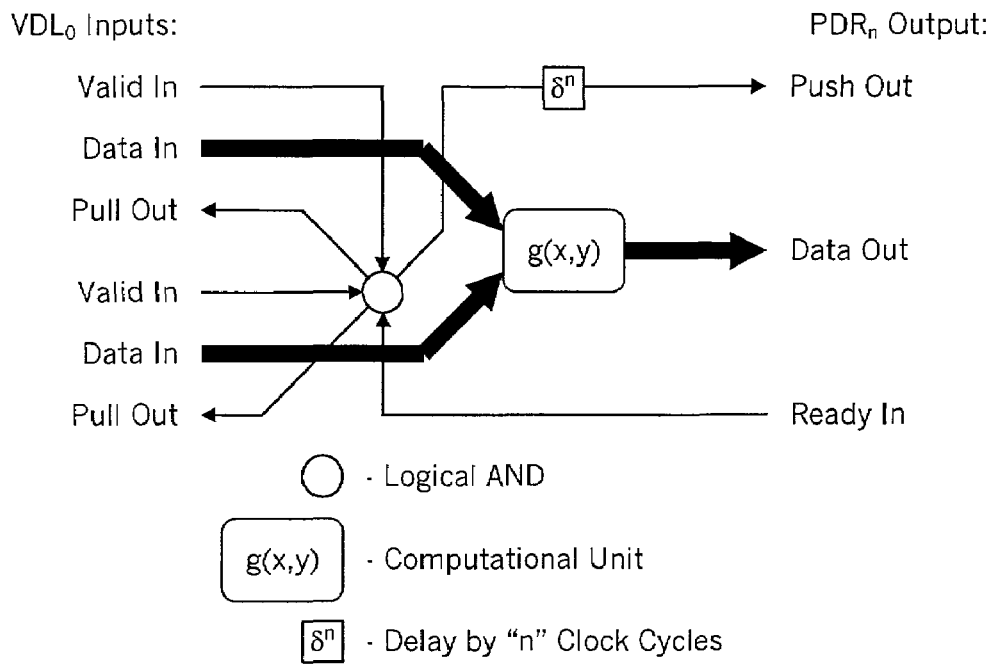
FIG. 11 illustrates an example Two-Input Computational Unit

The "synchronize" operator is particularly useful in the construction of computational units which require multiple inputs. FIG. 11 shows a computational component which accepts two $VDL_0$ inputs, applies a function to the data values, and produces a single $PDR_n$ output. Although the front end of the computational unit resembles a "synchronize" operator, really only one "push" and one "ready" signal are used. This optimization is the result, since both "push" outputs from the "synchronize" operation are the same signal, and an AND of the two "push" signals is logically equivalent to the signal itself. Similarly for the "ready" signal.

Figure 12:
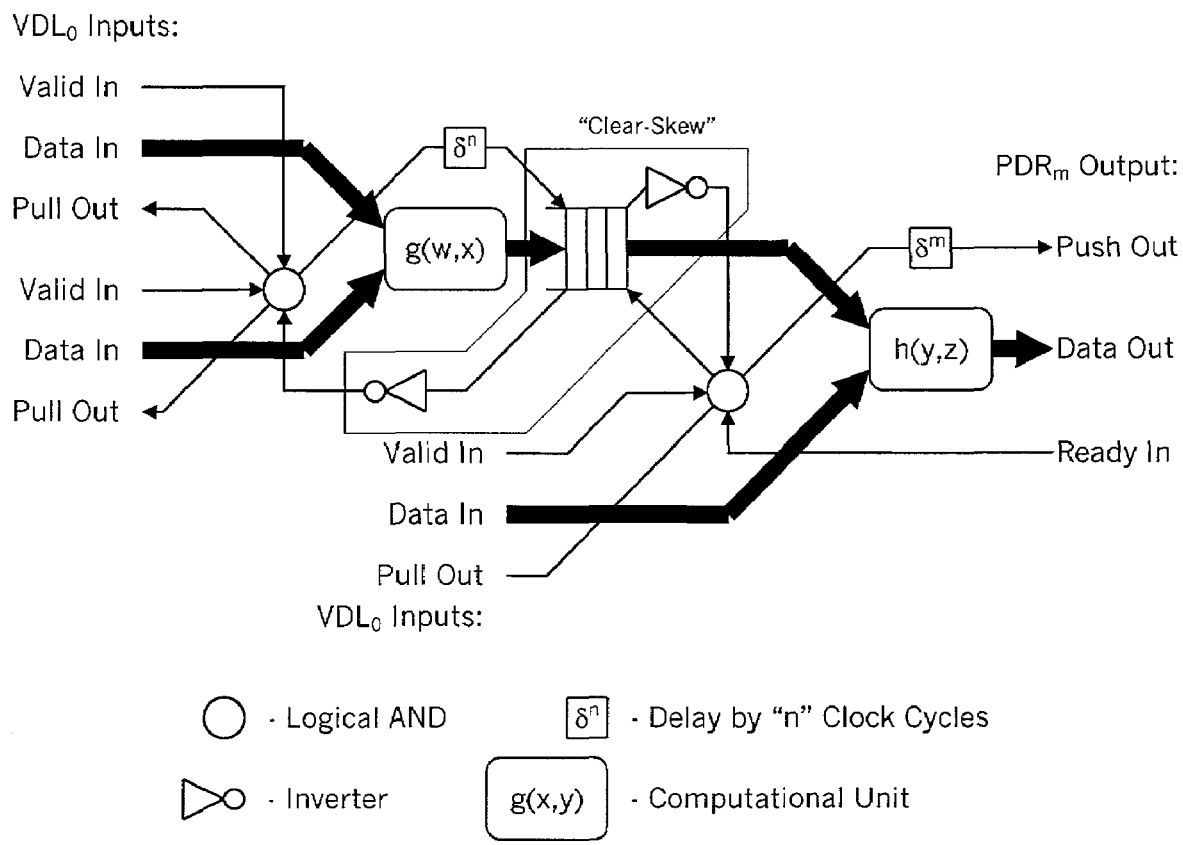
FIG. 12 illustrates cascading two Multiple-Input Computational Units

In order to cascade two such computational components, the $PDR_n$ output of the first must be converted to a $VDL_0$ signal to attach to the second. This is achieved using a variant of the "clear-skew" operator shown in FIG. 7. Because the output of the first unit is already using the PDR protocol, and the input of the second unit is expecting the $VDL_0$ protocol, it is only necessary to include the portion of the "clear-skew" operator between the dotted lines of FIG. 7, which is essentially a FIFO and two inverters. The resulting cascade of components is then as shown in FIG. 12. The "clear-skew" operator appears squeezed into the dashed outline, and its reserve should be set to the skew of the incoming PDR stream: "n".

The DX Protocol

The "synchronize" and "fan-out" operations are common, considering that any multiple-input operator needs to synchronize its inputs. In addition, significant logic simplifications may be achieved by recognizing that all "push" signals are identical, and that data consumption at the outputs of these operations is synchronized. Therefore, it is useful to capture the concept of a single, common "push" signal with a different protocol name. The name "DX" is given to this protocol, since the commonly passed signals would consist of the "data" and a more restricted "ready" signal.

The DX protocol does not explicitly route a "push" signal to components which support it. Most components do not need the "push" signal to function properly, and diligently tracking the skew of the DX busses provides enough information to create an appropriate "push" signal from the original, zero-skew "push" coming from the "synchronize" operator when such a signal is required. Therefore, in addition to an associated skew parameter, a DX bus is also considered to belong to a particular "push domain". The push domain is directly related to the "synchronize" or "fan-out" operator which generated the original DX signals. This push domain may be denoted as a super-scripted token immediately to the left of the "DX" specifier, such as: $_pDX_n$. The push domain is synonymous with the original zero-skew "push" signal generated by the "synchronize" or "fan-out" operator.

In addition to these specializations with respect to the "push" signal, components which manipulate DX signals must also take care when manipulating the "ready" signal. In particular, the "ready" outputs of a component can only be the logical AND of all of its "ready" inputs. The component can not mask off the "ready" signal in response to some data value or the "push" signal, and they can not delay the ready signal by any number of clock cycles. This restriction guarantees that a downstream conversion from DX to another DFC protocol will function properly. A DX component must always be ready to accept new data for processing (exceptions to this rule discussed further herein involve advanced pipeline design). A DX stream may eventually need to be converted to a less restrictive DFC protocol. One technique for performing this conversion involves reconstructing a valid "push" signal and reinterpreting the signals as PDR signals. This conversion is shown in FIG. 13

Figure 13:
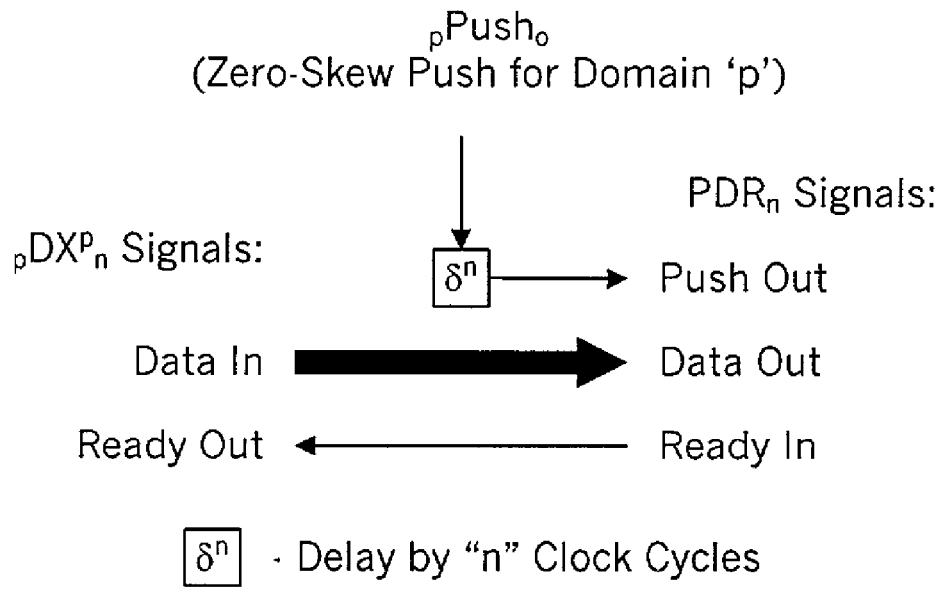
FIG. 13 illustrates conversion from $_pDX_n$ to $PDR_n$

For the purposes of simplification in an automated system, the delayed "push" signal generated in FIG. 13 may be managed by the original "synchronize" or "fan-out" operator that generated the DX signal. An operator may be queried for a "push" signal delayed by a particular amount, in order to avoid extensive replication of delay lines. Because of this, the operator is sometimes referred to as the "domain controller". Since converting from SX to PDR involves requesting the "push" signal from the domain controller, it is called a "get-push" operator.

In order to perform an operation on two DX inputs, the inputs must belong to the same domain and have the same skew. If one input has a lesser skew, this mismatch can be fixed by adding delay components. If the domains do not match, however, this difference requires that a completely new domain be created, and that the data be brought into this domain before the operation can proceed. While the concept of creating a new domain sounds overly complicated, it can be as uncomplicated as implementing a "synchronize" operation. In order to synchronize the inputs, however, the two incoming DX streams must be converted to PDR as shown above, and then into $VDL_0$ with the aid of a "clear-skew" operator.

Figure 14:
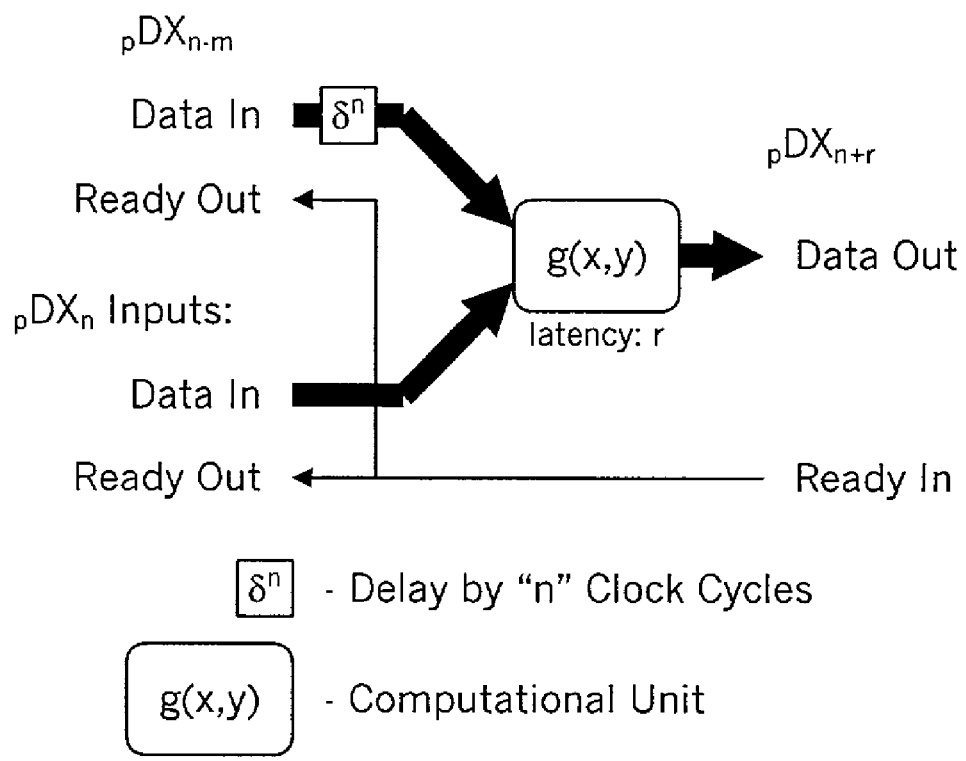
FIG. 14 illustrates computation on two DX Inputs with mismatched skew

FIG. 14 shows the first of the two cases, where the two DX streams have a mismatched skew. The DX component is a pipelined computational element, and the skew mismatch is resolved with a delay component. In the simplest case, this technique becomes a digital-design practice of matching up skewed input data and keeping tracking of the skew of the result. The DX protocol thus allows for extremely-low-overhead implementations of computations while maintaining the flexibility of reconverting to a full-flow-control data stream.

Figure 15:
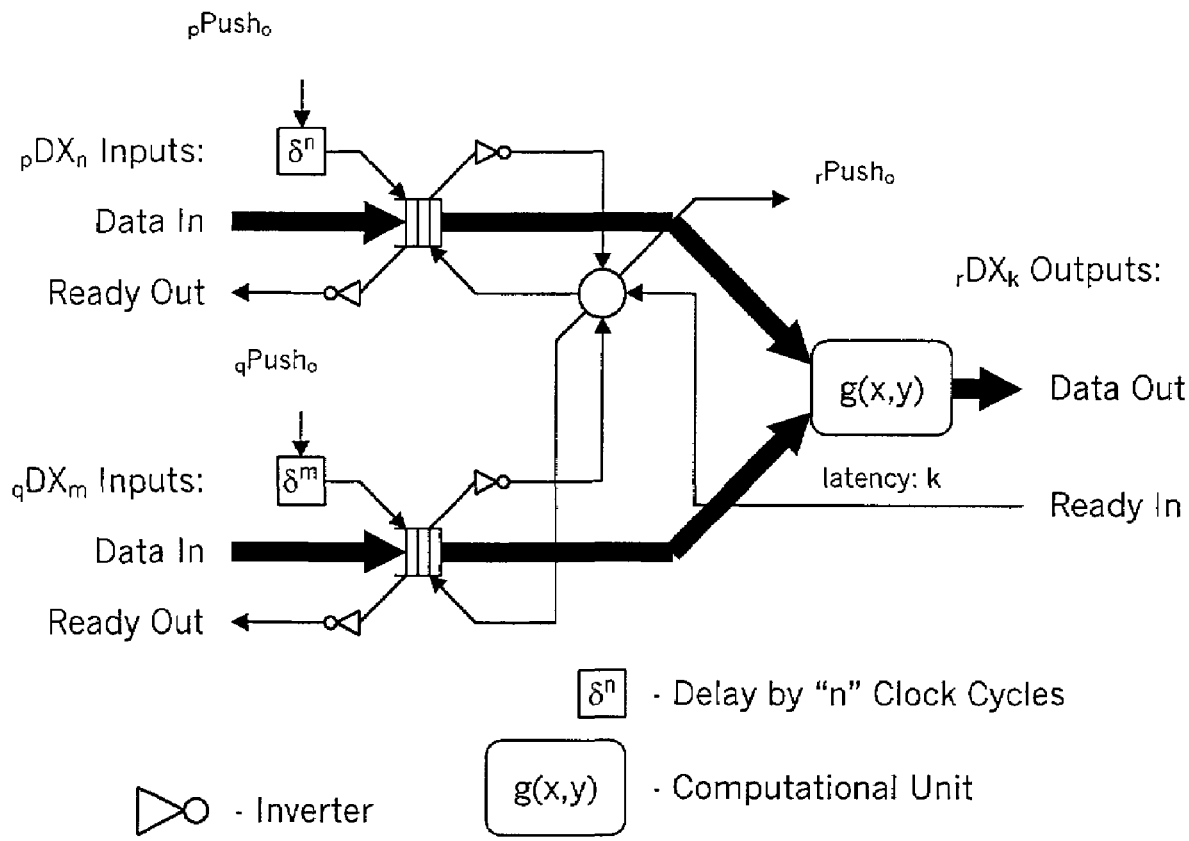
FIG. 15 illustrates computation on two DX Inputs from different push domains

FIG. 15 shows the second of the two cases, when the two DX streams come from different domains. The overhead involved is more costly than in the first case, but the simplicity of the conversion processes ensures the correct construction of the structure for proper functionality.

Figure 16:
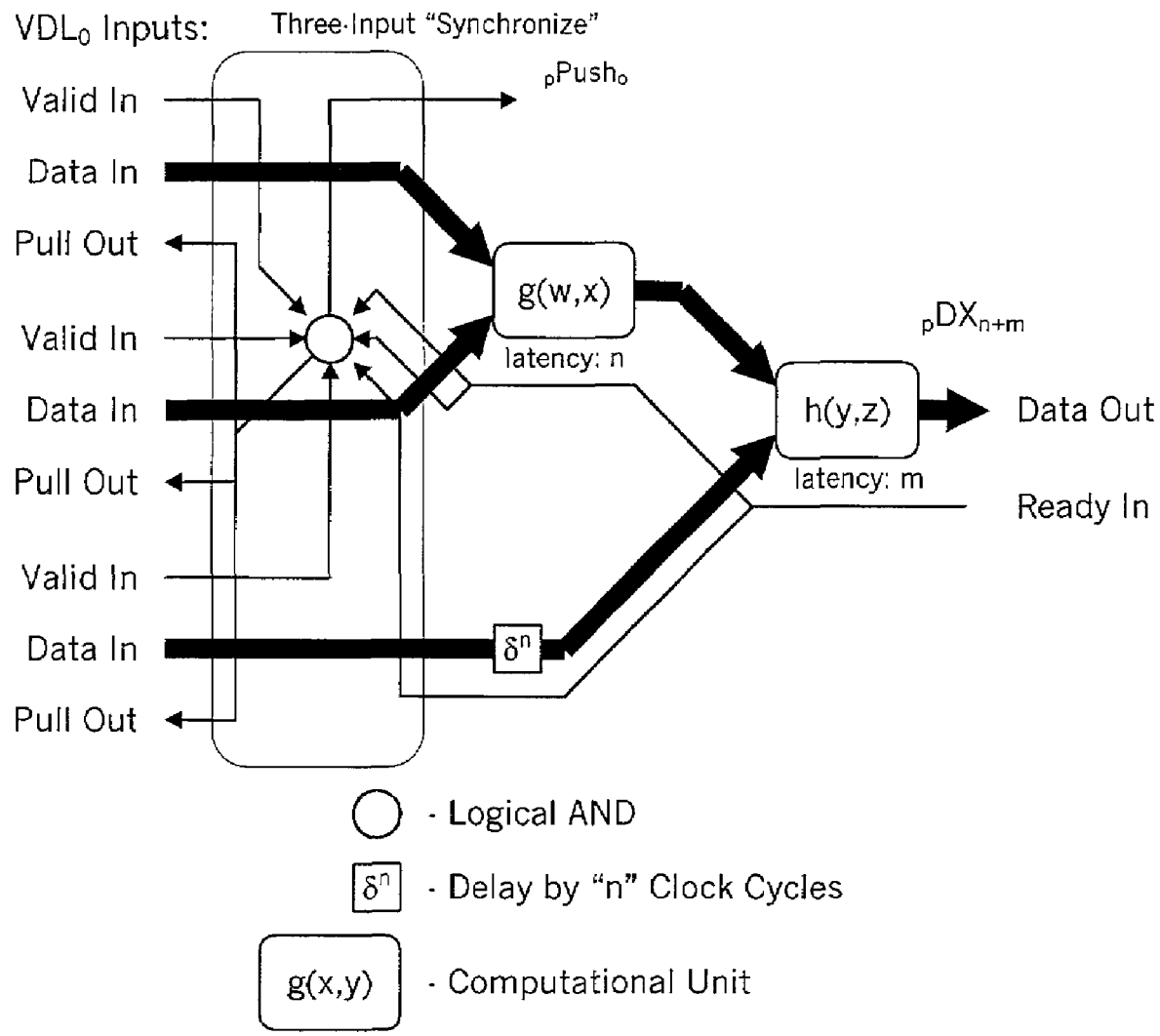
FIG. 16 illustrates cascading two Multiple-Input Computational Units using the DX Protocol

Another advantage of the DX protocol is seen when cascading two multiple-input computational elements and comparing the resulting hardware to that of the previous example that used VDL inputs and PDR outputs. FIG. 16 shows this result. To achieve the benefits, all three data streams used are synchronized in a three-input "synchronize" operator. This ensures that all three streams will be in the same domain when they are combined. The same "ready" input is fed to three separate inputs of the AND gate within the "synchronize" operator. This is a product of a systematic approach, and it is desirable for a tool implementing this form of design to be sufficiently intelligent to reduce the replicated inputs to a single line.

The PDX Protocol

In order to perform protocol transitions locally, an evolution of the DX protocol that relaxes skew constraints between "push" and "data" signals, as well as tracks the individual skew of each of the "push", "data", and "ready" signals may be used. This "PDX" protocol appears as a cross between the PDR protocol and the DX protocol. Any PDX signal thus has four associated parameters: skews for "push", "data", and "ready" signals, and the push domain. As an advantage over the PDR protocol, PDX signals originating from the same push domain can be synchronized with simple delay elements, rather than conversion to $VDL_0$. As an advantage over the DX protocol, any component, given PDX inputs, can create synchronization circuitry locally, without the need for operations such as "get-push", which requires inter-component coordination with the domain controller. Notation for a PDX signal consists of a subscript in front representing the push domain, and a subscript after every letter representing the relative skew of each of the three signals, such as: $_p P_0 D_8 X_{-1}$. In truth, the PDX protocol is a superset of the PDR and DX protocols.

Two disadvantages of the PDX protocol are the redundant application of delay lines to the "push" signal in components connected in parallel, and the wide (and potentially redundant) AND operation typically applied to "ready" signals. To alleviate the effects of these disadvantages, care may be taken in delaying "push" and "ready" signals. In particular, at each "fan-out" operation, the "push" signal can be delayed up to at least the skew of the "data" signal, with the assumption that this delay will be required just this one time. Delaying a "push" signal to a skew higher than the "data" signal may cause the "data" signal to have to be delayed further on, so "push" is typically not delayed for as long as possible. Furthermore, the "ready" signal, which is AND-ed at each "fan-out" operation, can be registered after the AND. This actually decreases the skew of the "ready" signal on the component's output. The individual skew of a "ready" signal is typically negative when not zero. This registering will alleviate timing concerns by breaking up the wide AND operation, but may aggravate redundancy concerns by making it more difficult for synthesis tools to recognize and optimize redundancies.

Figure 17:
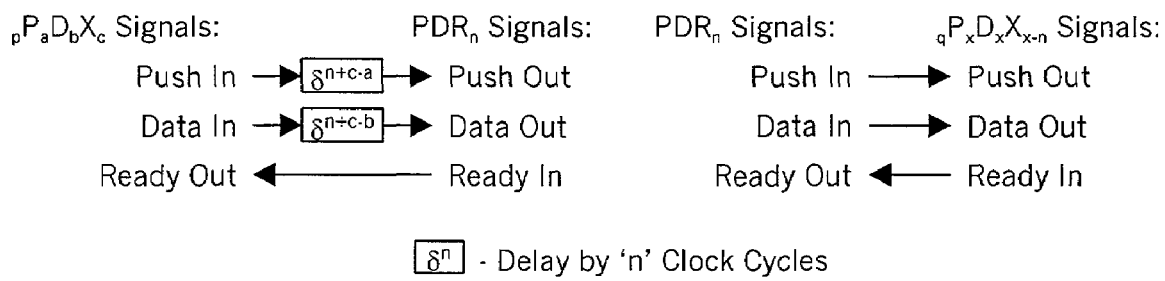
FIG. 17 illustrates converting between PDX and PDR with "re-sync" and "new domain" operators

The PDX protocol has no restrictions on the "ready" signal (but the "X" is kept as part of its name to imply that PDX is similar to DX). Such restrictions were required for the DX protocol because the individual skews were not tracked. As with the DX protocol, in order to perform a pipelined computation on two PDX data streams, the streams must belong to the same push domain and have the same skew on their "data" signals. If the PDX signals do not belong to the same push domain, a new one can be created by transitioning through the PDR, and VDL protocols to return to a PDX protocol with a new push domain. A $_p P_a D_b X_c$ signal can be converted into a $PDR_n$ signal, where n=max(a,b)−c by delaying the "push" or "data" signal up to a skew of max(a,b). The resulting "push", "data", and "ready" then use signaling identical to that of a $PDR_n$ signal and can be reinterpreted as such. Conversely, a $PDR_n$ signal may be reinterpreted as a $_q P_x D_x X_{x-n}$ signal for any value of x, so long as the push domain, q, is unique within the system. The acts of converting from PDX to PDR and back, "resync" and "new-domain", are illustrated in FIG. 17. The "new-domain" operation is a simple relabelling of signals.

Converting between PDX and DX protocols is also possible. A $_p P_a D_b X_c$ signal can be converted into a $_q DX_n$ signal, where n=b−c, by relabelling the "data" and "ready" signals and keeping track of the "push" signal in a fabricated domain controller. If c=0, the two push domains, p and q, may even be identical. If c≠0, the two push domains must be different, but they are related in that the "push" signal in domain q is thought to be decided upon c clock cycles earlier than that in domain p. Even though this results in identical "push" signals, changing the frame of reference has the effect of zeroing the skew of the "ready" signal (a prerequisite for the DX protocol). Because of this, the conversion is referred to as the "zero-ready" operation.

One caveat to this conversion is that it may be impossible to generate a zero-skew "push", so the "get-push" operator to convert from DX to PDR must take this into account. In fact, if a>b, it may be impossible to synchronize the "push" and "data" signals without having to delay the data. If the "get-push" operator is handled as a black box, with communication to the domain controller about the minimum available push skew, these restrictions can be handled seamlessly. It would just no longer be the case that a $_pDX_n$ signal is converted to a $PDR_n$ signal, but rather a $PDR_m$ signal, where m=max(a,n).

Figure 18:
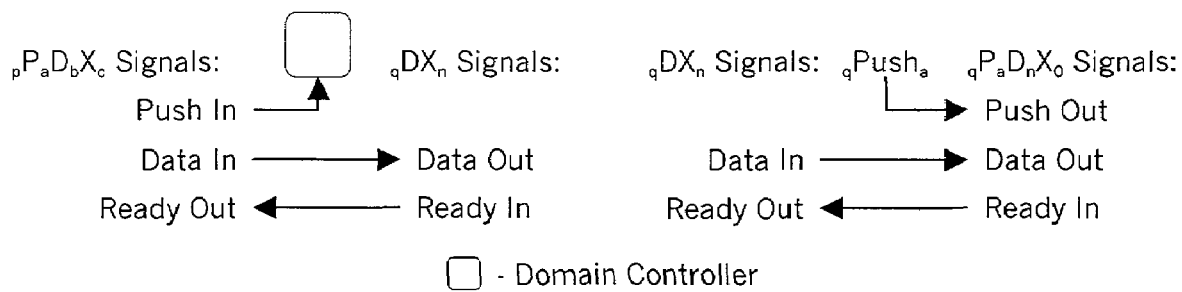
FIG. 18 illustrates simple "zero-ready" and "zero-push" operators

A $_pDX_n$ signal can be converted to a $_pP_0D_nX_0$ signal with a simple relabelling of signals, although if a zero-skew "push" is not available, it may only be convertible to a $_pP_mD_nX_0$ signal, where m is the minimum skew "push" available. In this conversion, the two signals remain within the same push domain. Because the zero-skew "push" is typically available from a DX signal, this operation is called the "zero-push" operator. FIG. 18 shows the simplicity of the "zero-ready" and "zero-push" operators.

Push Domains

A push domain is a reference point that refers to the decision to consume data. It is synonymous with a boolean function of discrete time which, at any given point in time (typically referred to as a "clock cycle"), describes whether or not a collection of data is about to be consumed. Usually, this decision is manifested in hardware as the generation of a zero-skew "push" signal used to pull data from FIFOs and push it into a logic structure which digests the data to produce a result. Thus, the push domain, the value of the function, and its electrically equivalent "push" signal all refer to the decision to consume data.

For PDX signals, the skew of each individual signal refers to its latency relative to the consumption decision. For simpler signal protocols, like DX and PDR, some of this information is lost. The DX protocol keeps the push domain reference, but looses the "push" signal and assumes the "ready" signal has zero skew. The PDR protocol looses the push domain, assumes the "push" and "data" signals are skewed by the same amount, and only remembers the difference between the common "push"/"data" skew and the "ready" skew (as this is the only number required to construct a "clear-skew" operator).

One issue that arises is: "what is making this consumption decision, and how is it making it?". Typically, the answer is that the "synchronize" operator decides upon the consumption of data by ensuring that all required data is available and there is room reserved downstream for the digested result (the product of all pertinent "valid" and "ready" signals). In general, a component which consumes one datum from each of its inputs to produce one datum on each of its outputs may make its own consumption decision identically to that of the "synchronize" operator, and may even incorporate a "synchronize" operator to make the decision for it. In such a case, all inputs to the component are $VDL_0$ and all outputs are at $_pDX_n$, and the component is the controller of its own push domain—its own consumption rate.

Other components may be slaves within a foreign push domain, where data consumption is decided by some external logic. The simplest of such cases is pipelined components where all inputs and outputs use the PDX or DX protocols within the same push domain. Other possibilities include components where one input is $PDR_0$, $_pP_0D_nX_0$, or $_pDX_0$ and the others are $VDL_0$, or where one output is $VDL_0$, and the others are PDR, PDX, or DX. These components are instructed on when to consume data by the incoming handshake signal of the odd input or output. The restriction on some skews being zero is due to the fact that the slave component must, on a clock-by-clock basis, recompute its outbound "ready" or "valid" signal.

Casting between Protocols

Figure 19:
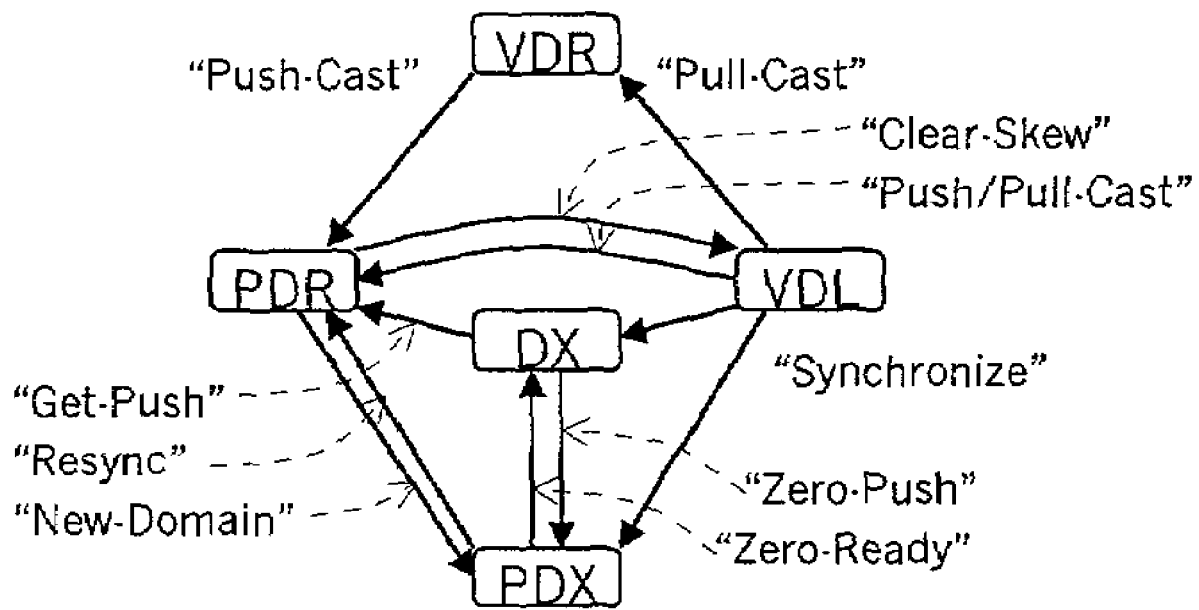
FIG. 19 illustrates Possible Casts Between DFC Protocols

Given the five protocols discussed (VDR, PDR, VDL, DX, and PDX), it is informative to consider the different options available for casting from one protocol to the next. In particular, any sort of protocol on the inputs to a pipelined computation must be cast to the DX protocol in order for the computation to proceed. Furthermore, it may be necessary to not produce an output of type DX where the domain controller is nested within the component, since retrieving the "push" signal from the domain controller may then need to alter the port map of the component. In such a case, the DX signal will likely be cast to a PDR signal before leaving the component. FIG. 19 shows the available options for casting between the various DFC protocols, and the operators used to do so.

One cast shown in FIG. 19 is a "push/pull-cast" operator. This operator would be the logical equivalent of concatenating the "pull-cast" and "push-cast" operators to transform a data path from $VDL_0$ to $VDR_0$ to $PDR_0$. The savings would be in the use of a single AND gate that generates both the "push" and the "pull" signal. This is also the equivalent of a single-input "synchronize" operation, followed immediately by a "get-push" operator, which would transform the data from $VDL_0$ through $_pDX_0$ to $PDR_0$.

Transitioning out of the DX and PDX protocols and back in must create a new push domain. This is due to the fact that transitioning to one of the other protocols loses the information about the push domain and signal skews relative to that domain. This information cannot be regained. Therefore, this information must be regenerated within the context of a new push domain.

Advanced Push-Domain Implementation Techniques

Because working with the DX protocol is similar to working on a simple pipelined structure, many of the techniques applicable to pipelining can be used to implement efficient push-domain hardware. Sharing pipelined hardware between two similar operations is possible, provided the required throughput is 50% (one result every two clock cycles) or less, and the two operations occur within the same push domain. Sharing takes the form of a multiplexor on the inputs to a unit and the fanning out of the outputs, with the realization that the outputs are only valid some of the time. Furthermore, the "ready" signal fed to the domain controller must be modulated by the duty cycle of the shared unit's availability.

The simplest form of such sharing occurs when a pipelined component which can accept one input per clock cycle is shared to perform N operations within the desired computation. A "modulo-N" phase counter can be used to modulate the "ready" signal fed to the domain controller, as well as control the multiplexor selecting inputs to the pipelined component. The use of this counter to control the multiplexor implies that the skew, 's', associated with an input which will be selected when the count value is 'x' must satisfy the following equation:

$$s \bmod N = x$$

Figure 20:
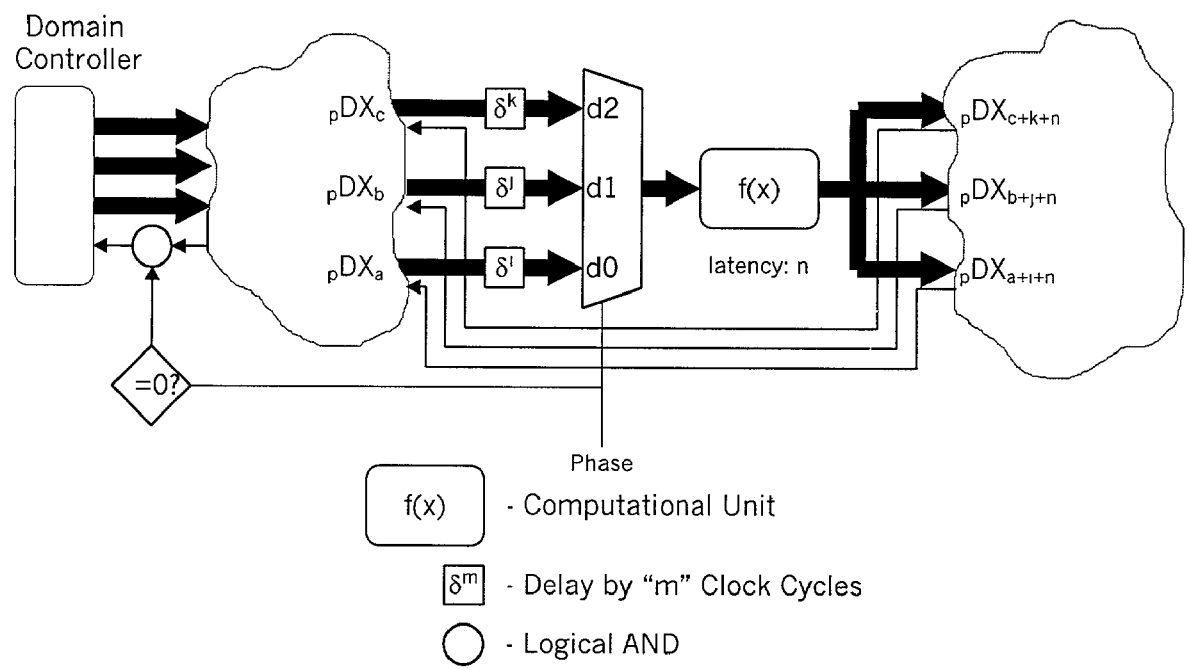
FIG. 20 illustrates Sharing a Single-Input Pipelined Component Using the DX Protocol

The skew, 'r', of the resulting output of the unit is then just 's+n', where 'n' is the latency of the component. If the above relationship can not be satisfied using the inputs directly, one or more of the inputs must be delayed enough clock cycles until it can. FIG. 20 shows an example of sharing a pipelined component among three operations. The delays 'i', 'j', and 'k' must be chosen such that '(a+i)mod 3=0', '(b+j)mod 3=1', and '(c+k)mod 3=2'.

Up to now, the only types of computational components considered herein were pipelined units which could accept an input on each clock cycle, and produced results after a fixed number of clock cycles from the input. This covers a majority of the useful high-performance components, but there may be instances where a computation is known to only need to be performed once in a while. If a computational unit's availability is more complex than "once every clock cycle", such availability may be expressed by modulating the "ready" input to the domain controller, as seen in the previous example. If, however, the unit's availability and latency is dependent on run-time data, it can not be covered with a simple modification of the "ready" signal.

Figure 21:
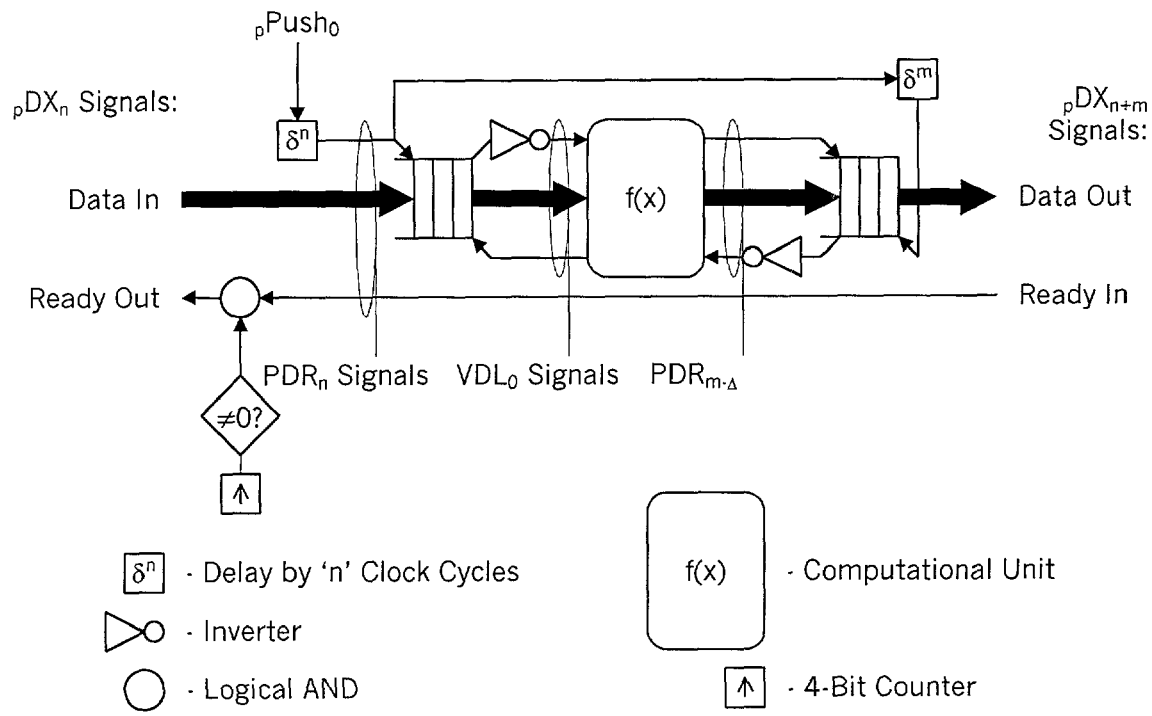
FIG. 21 illustrates Wrapping a Variable-Latency, Complex-Throughput Component While Maintaining the DX Protocol

Such components may require full-flow-control protocols such as VDL, VDR, and PDR. Converting from the DX protocol to a full-flow-control protocol and then back can incur a lot of hardware overhead. If it can be guaranteed that a component can sustain a particular worst-case throughput, a modulation that expresses no more than that throughput can be applied to the "ready" input of the domain controller, and FIFOs can be used to wrap the component and cushion the effect of it not being ready all the time. The "push" signal is then derived with a "get-push" operator to temporarily convert the units input from $DX_n$ to PDR. This "push" signal can then be delayed by the maximum expected latency, 'm' (which includes the latencies of the FIFOs), and used as the "pull" signal to convert back from VDL to $DX_{n+m}$. FIG. 21 shows an example of this technique as applied to a unit with a guaranteed throughput of 94%. Since the guaranteed throughput is close to, but not less than, 15 results every 16 clock cycles (93.75%), a four-bit counter can be used to modify the "ready" signal.

Since the "full" output from the front FIFO and the "empty" output from the back FIFO are ignored, there are complex statistical requirements which must be met by the computational unit in order for this structure to function properly.

Low throughput requirements may also simplify the conversion to $VDL_0$ at the end of a push-domain structure. Typically, such a conversion is implemented as a "get-push" operator (to convert from $DX_n$ to $PDR_n$) followed by a "clear-skew" operator (to convert from $PDR_n$ to $VDL_0$). In cases where the skew, 'n', is high and the required throughput of the structure is low, a straightforward implementation of the "clear-skew" operator can require an unnecessarily large FIFO. One way to side-step this issue is to modulate the "ready" signal of the "clear-skew" operator to restrict its maximum throughput to some percentage 'p'. The FIFO then need only be able to store a similarly reduced amount of data, with the "almost-full" threshold being set to when the FIFO has 'p·n' spaces left available.

Excessive, simplistic modulation of the "ready" signal in a push domain may cause undesirable effects. For instance, one unit that modulates it by allowing data every 3 clock cycles, factored in with another unit that modulates it by allowing data every 5 clock cycles will result in a throughput of one result every 15 clock cycles. For this reason, it is best for a programmatic process generating push-domain structures to react more intelligently to components with special throughput requirements, and to generate all control signals needed to constrict throughput in the push domain.

Figure 22:
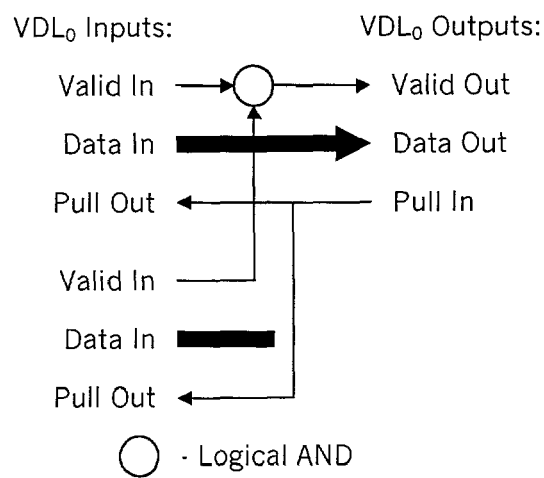
FIG. 22 illustrates a "Pacer" component
Figure 23:
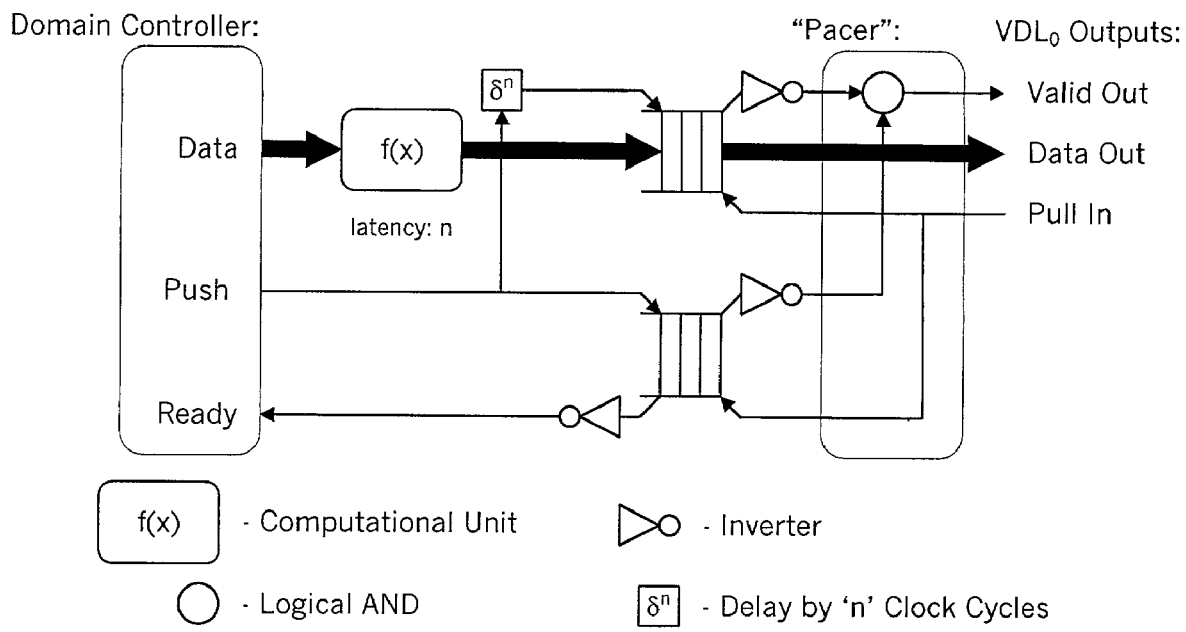
FIG. 23 illustrates using a "Pacer" to reduce the size of a "Clear-Skew"

An alternative method of reducing the sizes of "clear-skew" operators takes advantage of the fact that one and only one result is produced for every one set of inputs. Because of this fact, the computation can be "paced", by adding a gate at the front of the push domain which ensures that a FIFO used to clear the skew at the back of the push domain is sufficiently large to contain the outputs. FIG. 22 shows an example implementation of a "pacer" component, which synchronizes two $VDL_0$ input streams and produces a single $VDL_0$ output stream whose data comes from the first input. The second input is therefore used to throttle the throughput of the first.

The "pacer" component is used to reduce the size of a FIFO in a "clear-skew" operator by placing two matching FIFOs at each of its inputs. These FIFOs produce $VDL_0$ outputs, the first of which is fed through the "pacer" components input to its output, as the $VDL_0$ result of the computation performed in the push domain. The second is a regular "clear-skew" implementation, which ensures that the first FIFO will never overflow by disallowing any inputs into the push domain which would eventually produce too many outputs. The AND gate within the "pacer" may not be necessary in such a configuration, as it may be assumed that the pacer FIFO is always valid whenever the data FIFO has valid data.

Because the data for the second input to the "pacer" is unused, it need not be routed to the FIFO. In fact, all that truly needs to be implemented for the second FIFO is the controller which determines "empty" and "almost-full" signals. This implies the need for a "void" data type, for which the value of the data being passed is not important, but the control signals used to pass the data are important. The "void" data type is thus used to implement explicit control structures using what appear, at first glance, to be computational elements.

Higher-Level DFC Components

The DFC protocols provide an explicit specification of the presence of valid data through either the "valid" or "push" handshake signal. It also denotes explicit consumption of data through the "ready" and "pull" handshake signals. This explicit presence and consumption gives data passing through the system an almost physical analog, in which the designer must ensure that data is neither created nor destroyed inappropriately. These restrictions imply a collection of structures unique to explicitly present data.

Figure 24:
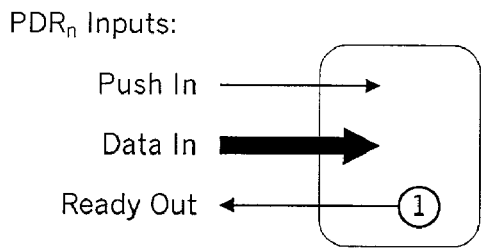
FIG. 24 illustrates a "Null" component

The simplest such structure is one with a single input and no outputs which consumes all data passed in to it. This component is always ready to accept input, so its implementation, shown in FIG. 24, simply ties its "ready" line high and ignores its "push" and "data" inputs. Because of its similarities to the '/dev/null' pipe found on UNIX systems, this component is called "null". Although trivial, the "null" component is required for a functionally complete system in order to easily discard unused results.

Figure 25:
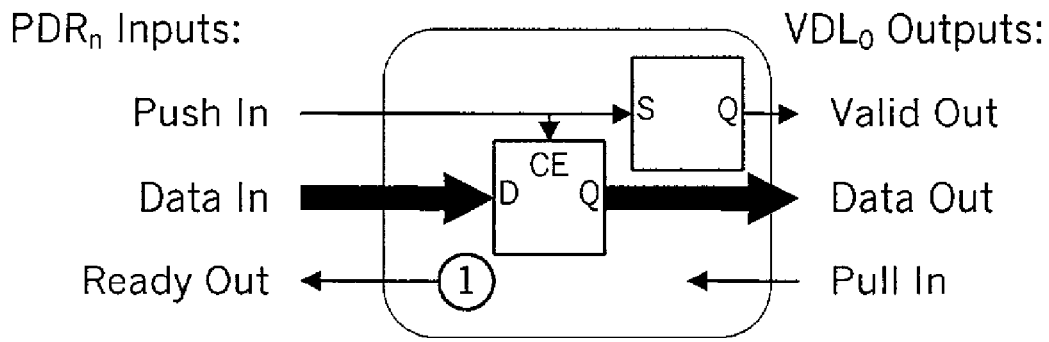
FIG. 25 illustrates an "Echo" component

Related to the "null" component is a single-input, single-output component which accepts all incoming data, and repeats it on its output until a new input arrives. This "echo" component, as shown in FIG. 25, provides a technique for repeating data indefinitely.

Figure 26:
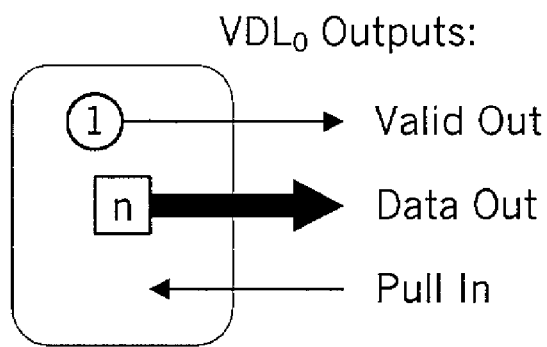
FIG. 26 illustrates a "Constant" component

Another component is the "constant" component, whose data is always valid, regardless of the state of the "pull" input. This component is shown in FIG. 26. The value of the output data is always 'n'.

Figure 27:
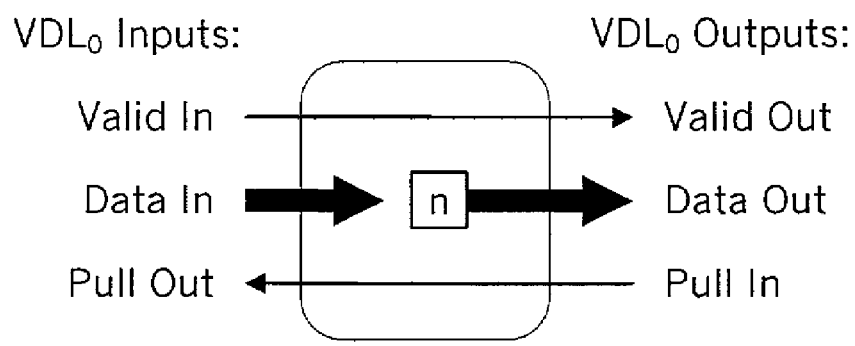
FIG. 27 illustrates a "Controlled-Constant" component

A slight variation of the "constant" component is a "controlled-constant" component. An implementation of such a component is shown in FIG. 27. "Controlled-constant" components are typically used as a trigger to initiate a computational process that requires constant data of some form. The input data format can be anything, and its value is unused, in favor of the constant 'n'.

Figure 28:
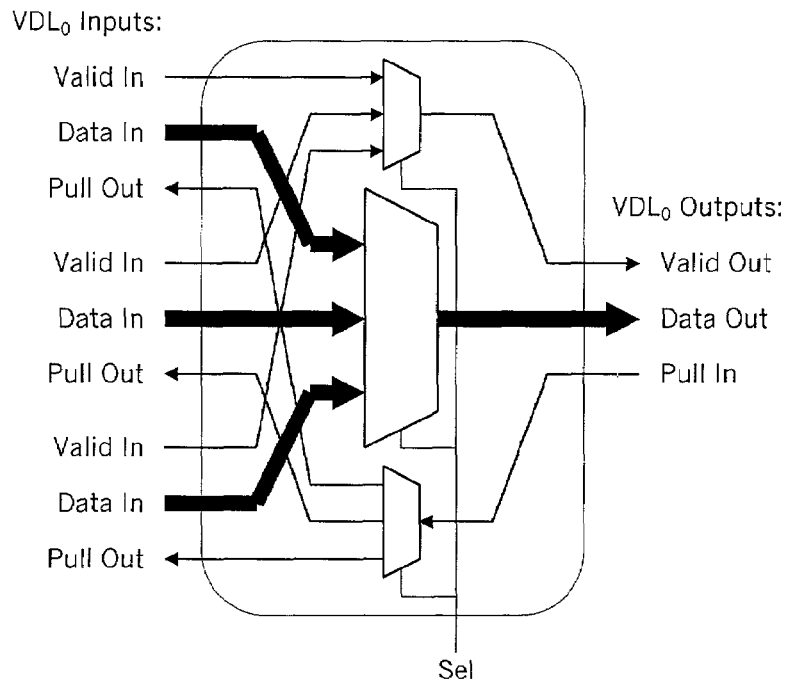
FIG. 28 illustrates an example "Switch" component

The most basic structure which justifies a need for full flow control is that of a "switch" component. This component is similar to a multiplexor, except that data on a deselected input is not consumed, and remains at the input until it is selected. The selection control is unspecified, for now, and comes in through a raw data connection, "sel". FIG. 28 shows an example implementation of a three-input "switch" component, which is simply two multiplexors and a demultiplexor. The full-flow-control protocols are required, given the introduction of a "switch" component, due to the fact that some of its inputs may block transfers in a manner dependent on the value of run-time data.

Figure 29:
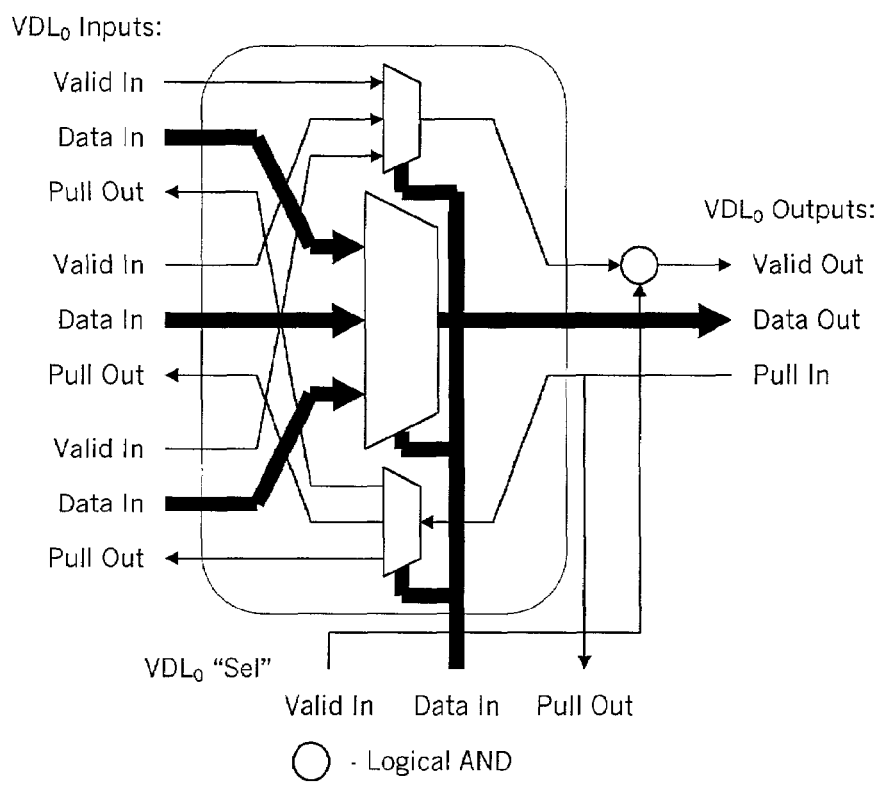
FIG. 29 illustrates an example "Merge" component

A slight variation on the "switch" component is the "merge" component, in which the "sel" input uses a DFC protocol instead of just raw input data. The values on "sel" are then pulled whenever the main output is pulled, and the main output is valid only when the "sel" input is valid. Thus, an implementation of the "merge" component is shown in FIG. 29 as having an additional AND gate to determine the "valid" output, and routing the "pull" input to both the "pull" line for the "sel" port as well as the demultiplexor.

Figure 30:
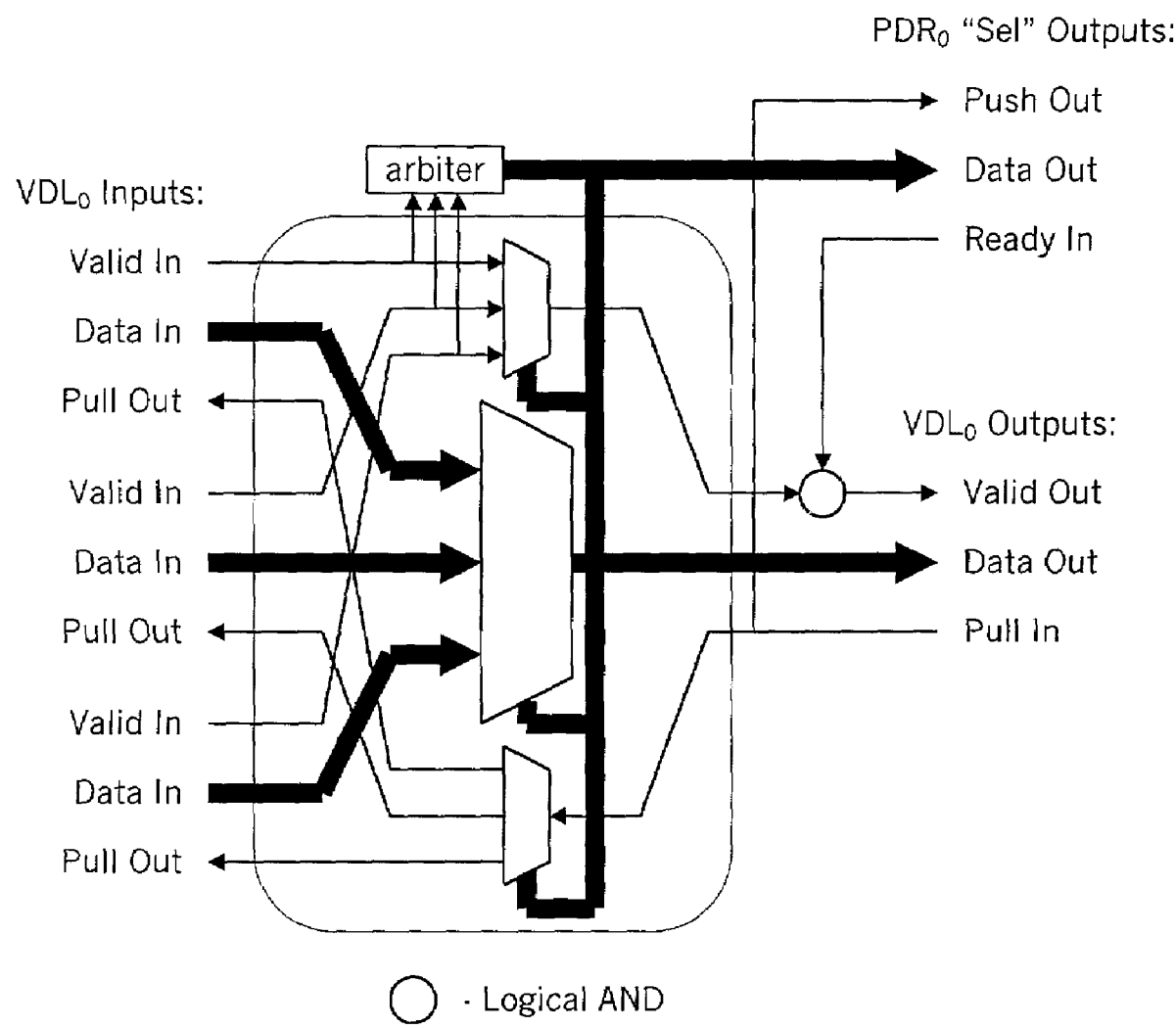
FIG. 30 illustrates an example Implementation of "Auto-Merge"

A second variant of the "switch" component is one that automatically determines which input to select. This determination can be any arbitrary logic function, but it is typically a function of the "valid" lines on each of the inputs. The arbitration logic (arbiter) is thus fed each of the "valid" signals, and produces a selection. In order to track which input corresponds to each output, an output similar to "sel" is produced for each data value that passes to the main output. In this way, the multiplexed output stream may then be demultiplexed further downstream using the information on the "sel" port. An example of this "auto-merge" component is shown in FIG. 30. The logic for the arbiter is defined by the application.

Figure 31:
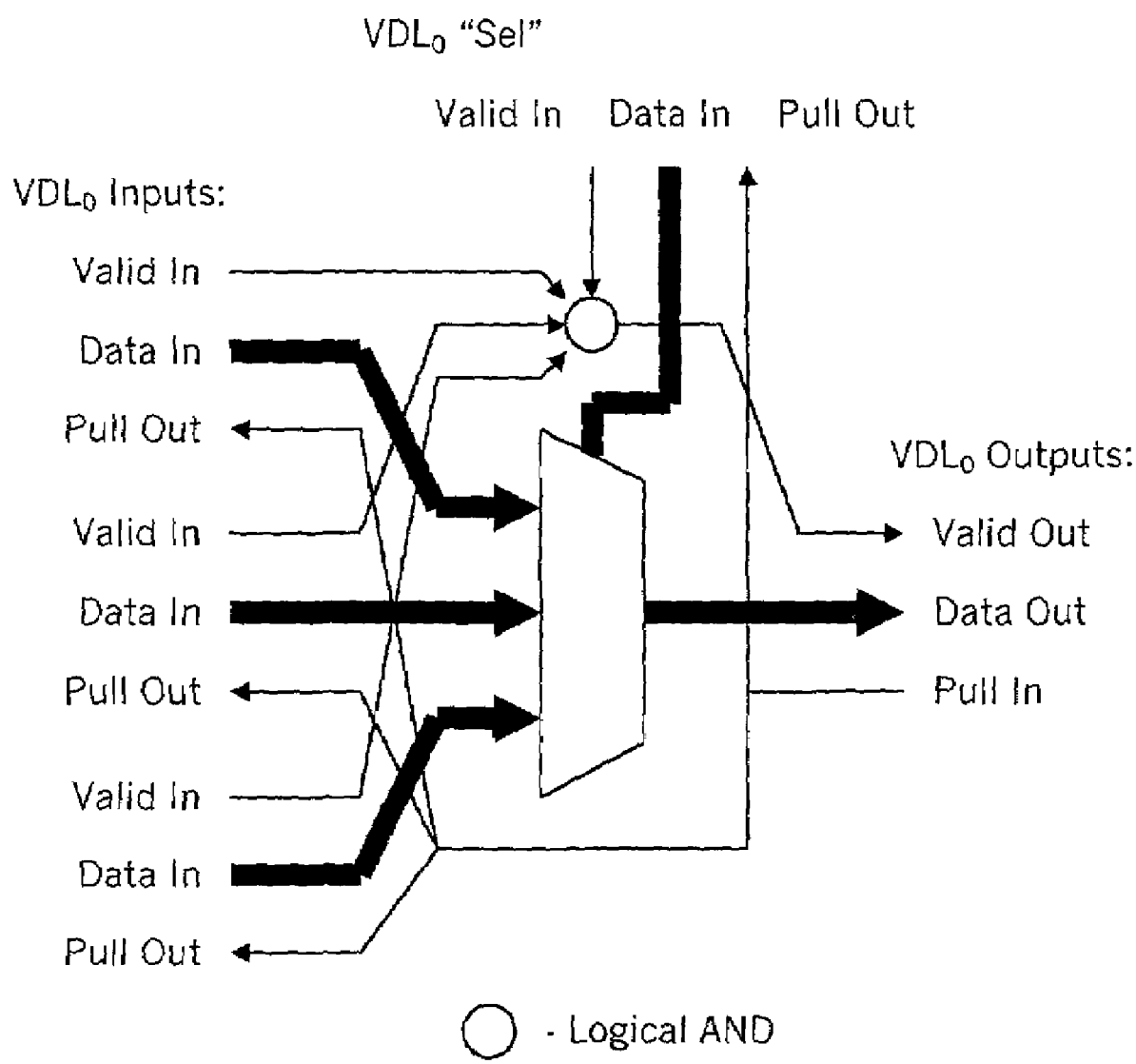
FIG. 31 illustrates an example "Sift" operator

Both variants of the "switch" component consume only one of their main inputs for each output produced. An alternative type of selected-input component is one in which all main inputs are consumed for each output. This alternative, known as the "sift" operator, is similar to a common multiplexor, and can be implemented using the DX protocol as just a multiplexor. FIG. 31 shows an example implementation of the "sift" operator using full-flow-control protocols. Note that it is simpler than wrapping a DX-protocol multiplexor with "synchronize" and "get-push" operators, since its output remains at $VDL_0$.

Conditional constructs can typically be implemented using a "fan-out" operator to feed both branches of the condition, followed by a "sift" operator to select the appropriate result given the value of the condition.

Figure 32:
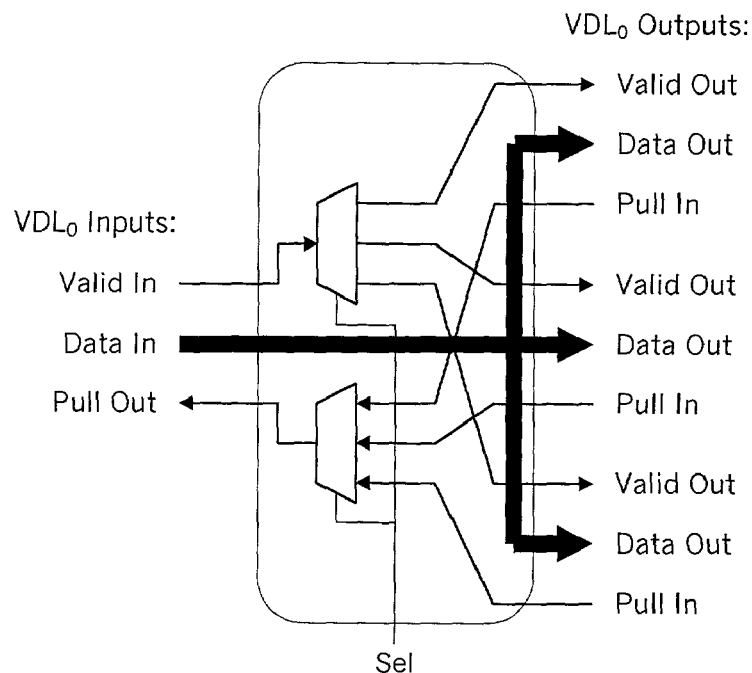
FIG. 32 illustrates an example "Deswitch" component

The inverse of the "switch" component is the "deswitch" component, which takes a single input and connects it to one of multiple outputs. As with the "switch" component, the selection control comes in through a raw data connection, "sel". FIG. 32 shows an example implementation of a three-output "deswitch" component, which is simply one demultiplexor and one multiplexor.

Figure 33:
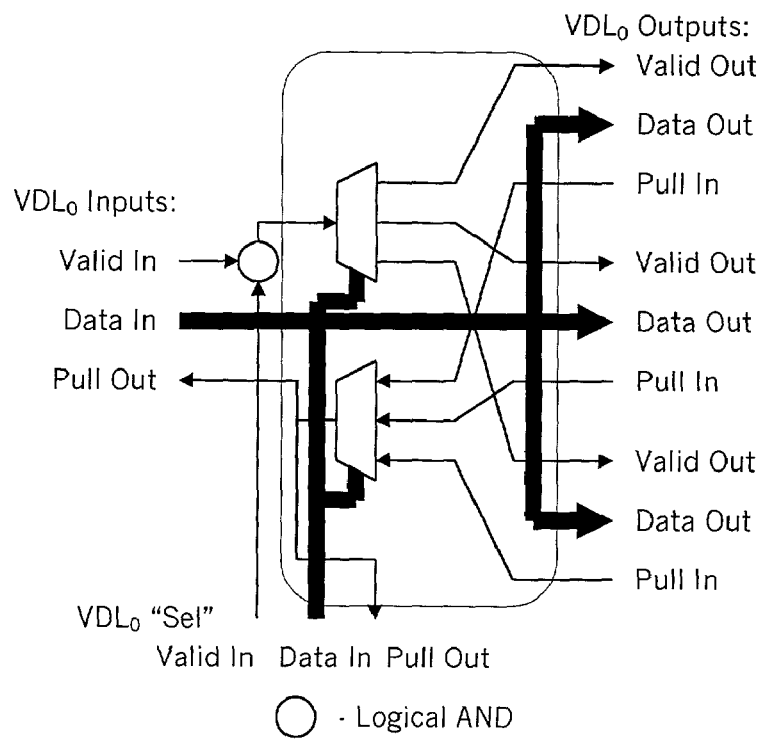
FIG. 33 illustrates an example "Route" component

As with the "switch" component, the "deswitch" component can be made so that the "sel" input uses a DFC protocol. FIG. 33 shows such an implementation, referred to as a "route" component, where the "valid" signal for the "sel" line is AND-ed with the "valid" signal for the input, and the "pull" signal for the input is fanned out to the "sel" line's "pull" signal.

Figure 34:
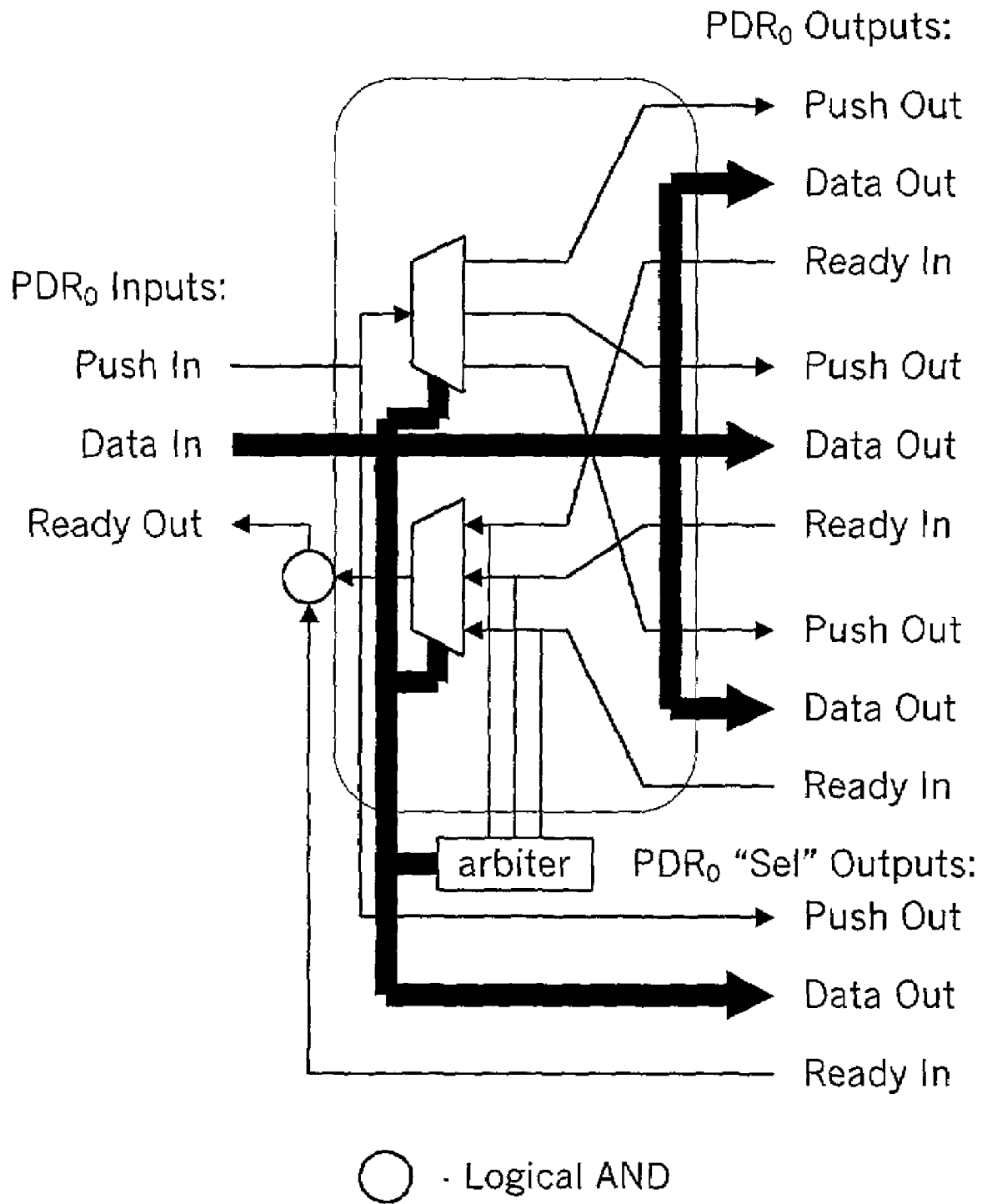
FIG. 34 illustrates an example "Auto-Route" component

As with the "switch" component, there is a second variant of the "deswitch" component in which the "sel" signal is automatically determined by an arbitrary logic function. In this variant, $PDR_0$ signals are used in place of $VDL_0$ signals, and the arbiter is fed the "ready" signals of all the outputs. FIG. 34 shows an implementation of this "auto-route" component.

Figure 35:
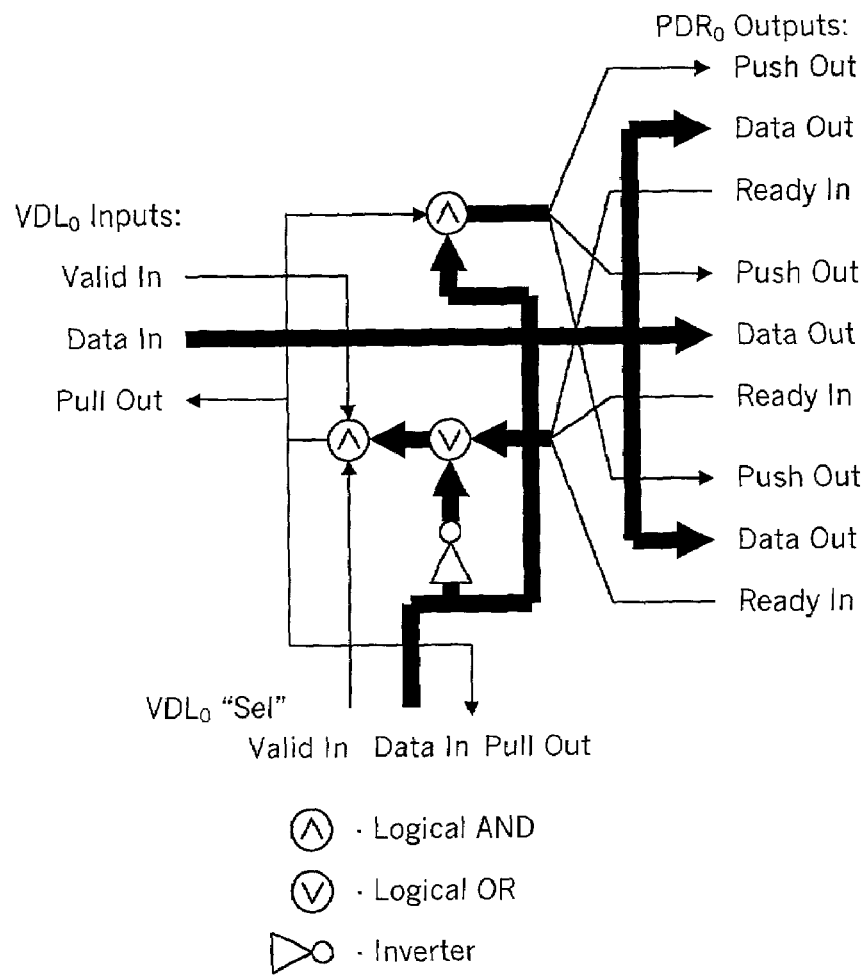
FIG. 35 illustrates an example "Route-Mask" component

A third variant of the "deswitch" component is the "route-mask" component. This component takes a bit mask as the "sel" input and routes the incoming data to all outputs for which the corresponding bit in the mask is a one. With such a component, a "sel" input of all zeros will discard the incoming data, whereas a "sel" input of all ones will broadcast the incoming data to all outputs. This component is implemented by performing a bit-wise logical OR of the "ready" inputs with the inverse of the "sel" mask and then generating the vector AND of the resulting bit vector concatenated with the "sel" and input's "valid" signals to determine the "pull" and "push" outputs. FIG. 35 shows an implementation of this component. This component becomes useful when overlapping portions of the same input stream are required to be routed to various computational components. A degenerate form of this component which has only one output may be used to filter out unwanted elements of a data stream based on an arbitrarily complex condition fed to the "sel" input.

Figure 36:
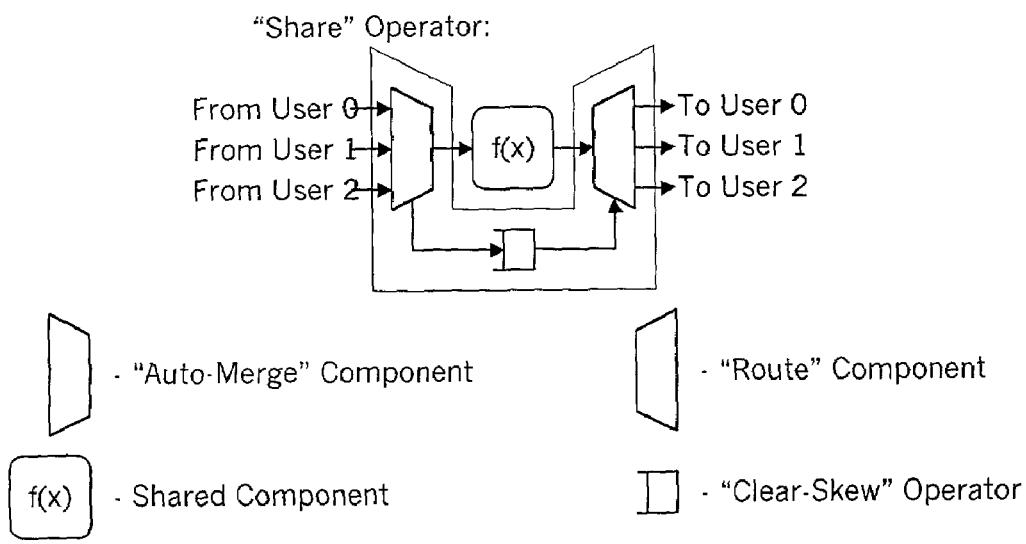
FIG. 36 illustrates an example "Share" operation

With the existence of an "auto-merge" component and a "route" component, it is possible to manually share a general computational unit between multiple users. Each user's input to the shared unit is fed to a unique input of the "auto-merge" component. The output of the "auto-merge" is then fed to the computational unit, whose output is fed to the "route" component. The "sel" line of the "route" component is driven by the "sel" output from the "auto-merge" (after the appropriate conversion from $PDR_0$ to $VDL_0$ using a "clear-skew" operator) and the outputs of the "route" component are used as the results for the users tied to the corresponding inputs on the "auto-merge". FIG. 36 shows a high-level example of this implementation of a "share" operation. Sharing a component can save space within a design if a large computational element is used in multiple, low-throughput paths, but it is most appropriate when that component is a physical, single resource, such as a memory.

This simplistic form of sharing an operator may lead to deadlock situations, where data attempting to leave the computational unit is supposed to be routed to a particular user who will not be ready for more data until it receives a second input from another user sharing this same computational unit. To avoid this situation, it is more appropriate to fan out each user's input and route it to the pacing input of a "pacer" component. The "pacer" is then used to pace the user's output stream. Because fanning out a DFC stream will typically generate a PDR stream, there will be "clear-skew" operators just before the inputs to the "auto-merge" and "pacer" component, which will allow the first computation to be performed. The size of the FIFOs in these "clear-skew" operators will directly affect how many outstanding requests can be propagating through the shared computational unit, and may adversely affect the utilization or throughput of the structure if the size is too small compared to the latency of the computational unit.

Figure 37:
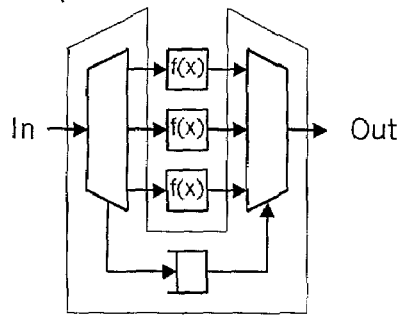
FIG. 37 illustrates an example "Serve" operation
Figure 37:
Figure 37:
Figure 37:
Figure 37:

In a manner similar to the "share" operator, if the user wishes to create multiple identical computational units to improve the throughput in the case where each individual computational unit's throughput is lower than one result per clock cycle, a "serve" operator can be manually constructed using an "auto-route" and "merge" component. The main input goes in to the input of the "auto-route" and each output of the "auto-route" is fed to a unique computational unit. Each computational unit's output is the fed to the corresponding input of the "merge" component, and the output is the final result. The "sel" input of the "merge" is driven using the "sel"

output of the "auto-route" after the appropriate conversion from $PDR_O$ to $VDL_O$ using a "clear-skew" operator. FIG. 37 shows a high-level example of this implementation of the "serve" operator.

Figure 38:
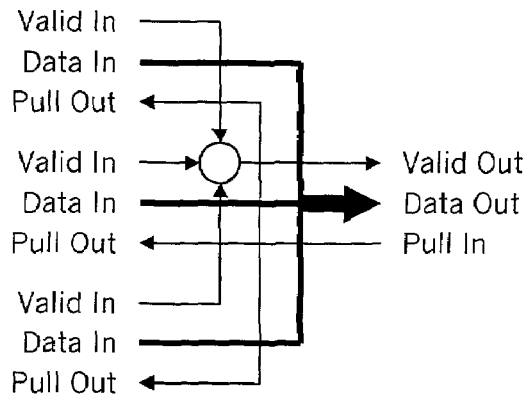
FIG. 38 illustrates examples of "Group" and "Ungroup" operators
Figure 38:
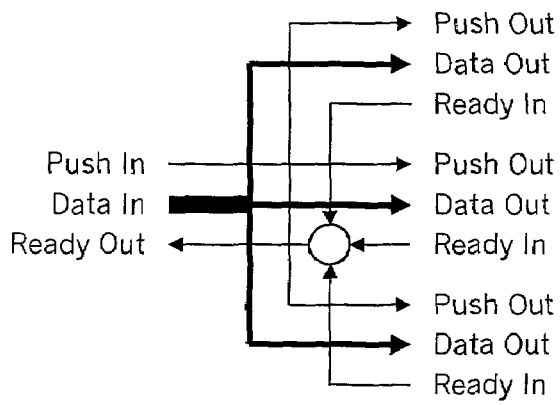
Figure 38:
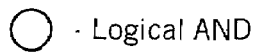

The example "share" and "serve" operations shown above only describe how to use single-input and single-output computations. When dealing, for example, with sharing a multiple-input computation, it is inappropriate to attempt to replicate "auto-merge" components, since there is no guarantee that each component will select the same user's input. Thus, the computation would effectively be performed on a random collection of inputs. Instead, it is convenient to introduce a "group" operator, which assembles individual streams into a single input, and an "ungroup" operator, which breaks a group into individual streams. This grouping and ungrouping can then be performed on either side of the various "merge" and "route" components to make the computation being "share"d or "serve"d effectively appear as a single-input single-output operation. A "group" operator is implemented by performing a "synchronize" operation on the individual inputs and then concatenating the resulting data outputs. An "ungroup" operator is a simple "fan-out" operator followed by each output taking a slice of the original data. FIG. 38 shows an example of these operators.

Figure 39:
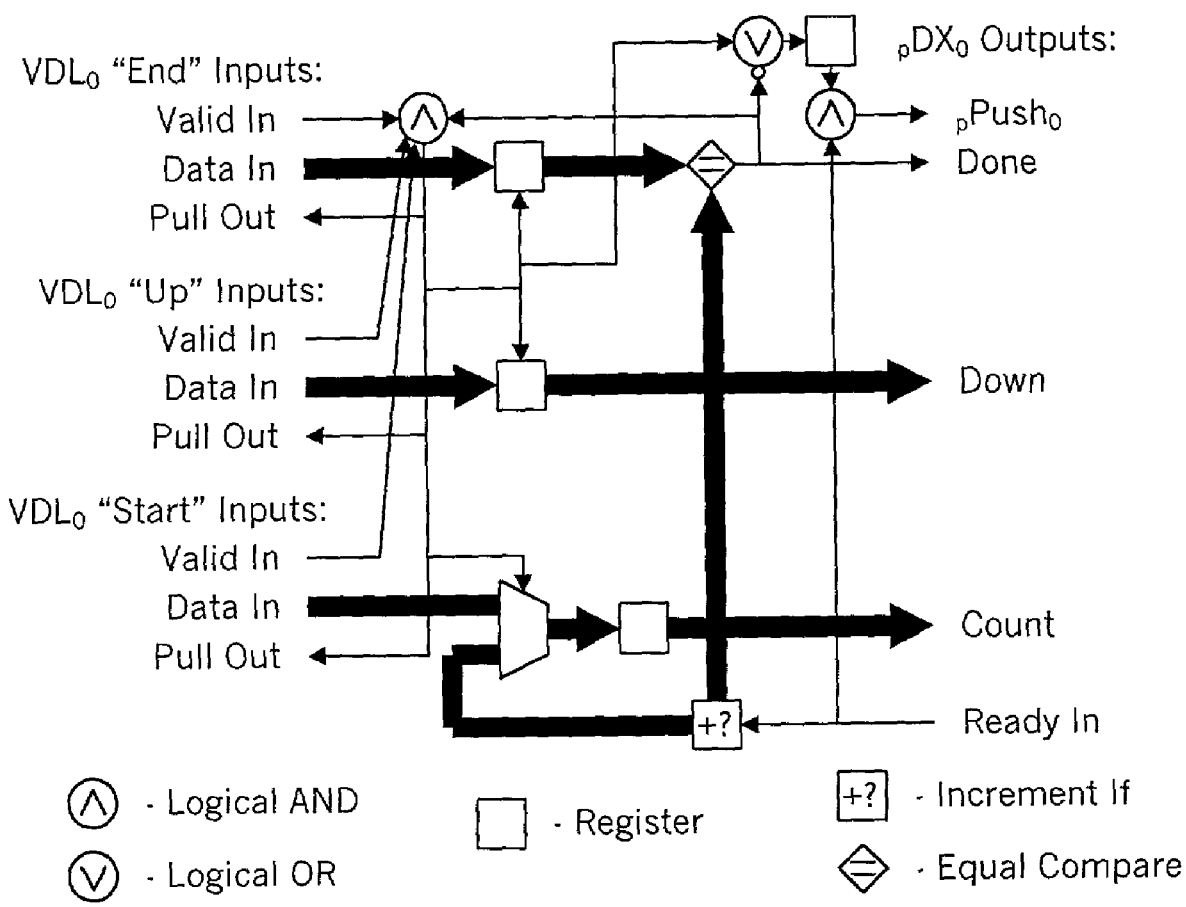
FIG. 39 illustrates an example "Iterate" component

A basic high-level construct is that of the loop. While loops could be manually crafted with simple components such as "increment" and "merge", it is typically more efficient to produce a single component, which accepts "start" and "end" values for the count, as well as an "up" input to be reproduced 'N' times as an output (where 'N=end−start+1'). FIG. 39 shows an example "iterate" component. This component accepts a "start", "end" and "up" value to produce "done", "down", and "count" streams. The "done" stream is a single bit which is zero for the first 'N−1' times and one for the last time. The "down" stream is a repetition of the value retrieved from the "up" port for 'N' times. The "count" stream is a numerical value whose first value is "start" and last value is "end". An "iterate" component is a domain controller, producing its own push signals.

Figure 40:
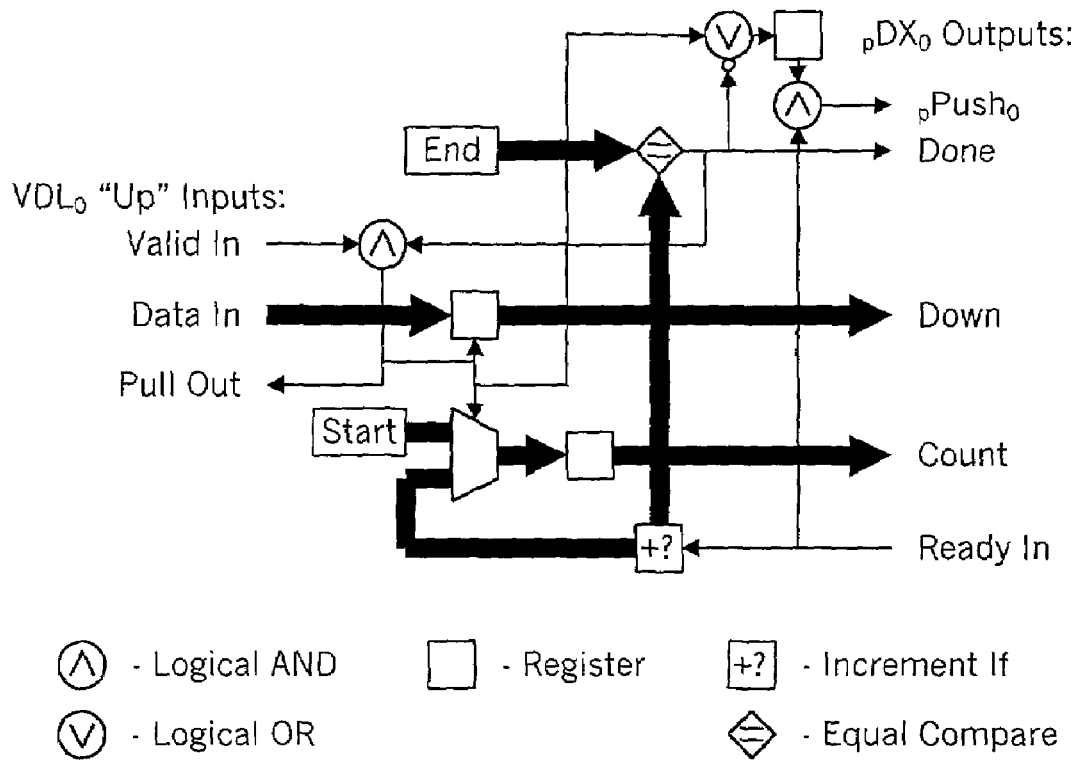
FIG. 40 illustrates an "Iterate-Const" implementation

A variant of the "iterate" component is one in which the "start" and "end" values are constant for all time. This is a common occurrence, used either to generate a repeating "count" stream or to replicate data more precisely than with an "echo" component, and can greatly simplify the implementation of the component. FIG. 40 shows an example implementation of this "iterate-const" component.

Figure 41:
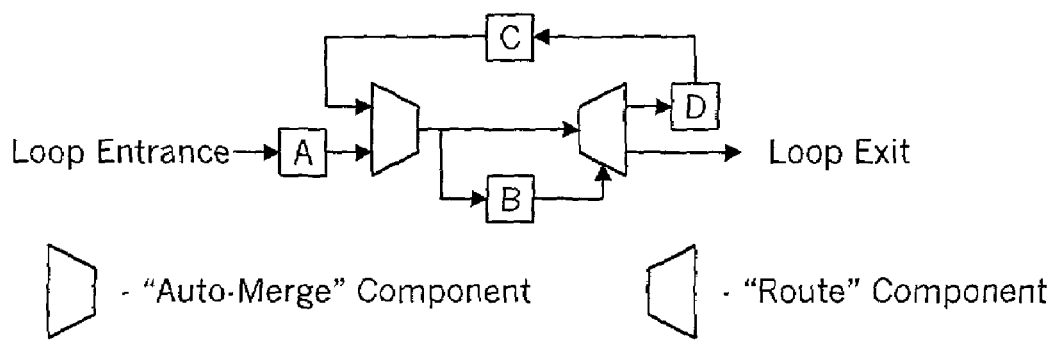
FIG. 41 illustrates a general implementation of a 'For' Loop

Loops having non-constant exit conditions or data dependencies between separate iterations of the loop must be manually constructed. To achieve this, a two-input "auto-merge" component is used at the entrance of the loop, where one input to the "auto-merge" represents initial entry into the loop and the other input represents re-execution of the loop body. Two-output "route" components may be used for exit conditions as many times as desired around the loop body, where one output of the route represents continuing execution of the loop and the other output represents an exit from the loop. FIG. 41 shows a simple implementation of a 'for' loop as found in the C programming language: "for(A; B; C) D;".

There are some intricacies involved in implementing 'for' loops as shown in FIG. 41 that are important to note. For one, it becomes important what arbiter is used with the "auto-merge" component in order to avoid deadlock. The arbiter must always prefer the feedback path whenever data is available there, or else "clear-skew"s in 'B', 'C', and 'D' may fill to capacity, ceasing the normal operation. Also, if FIG. 41 is an implementation of a nested 'for' loop, several iterations of an outer loop may be executing the inner loop simultaneously, unless explicitly forbidden to do so. Therefore, the iterations may leave through the loop exit out of order. Finally, all data pertinent to the computations within the loop, even run-time values which are not altered during execution of the loop, must be fed into the "auto-merge" component in order to ensure that it is available the appropriate number of times for the 'B', 'D', and 'C' computational elements. This becomes particularly important when 'B', 'D', or 'C' perform memory writes. To guarantee correct execution in such instances, the entire memory must effectively be passed into the loop. This can be achieved by locking the memory, thus restricting execution of the loop to one iteration at a time. This, in turn, can usually be reduced to simply restricting execution of the loop to one iteration at a time.

Figure 42:
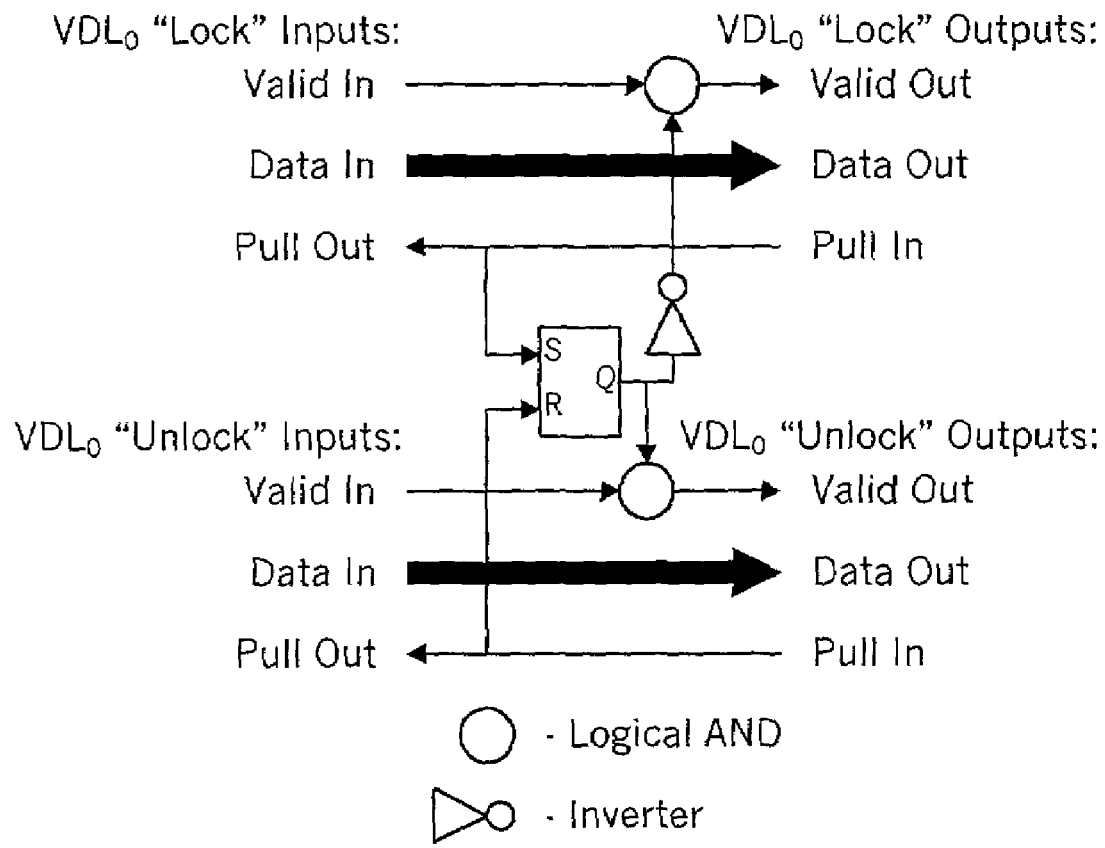
FIG. 42 illustrates a "Mutex" component

Locking a portion of a dataflow graph so that only one element of data can reside within it at any given time is achievable using a "mutex" component. The "mutex" component has two data throughways which must be traveled alternately: one piece of data must go through the "lock" throughway before data is allowed through the "unlock" throughway. This locking and unlocking is then performed on either side of the restricted structure, ensuring that only one data item is operating within the structure at any time. FIG. 42 shows an example implementation of the "mutex" component.

Figure 43:
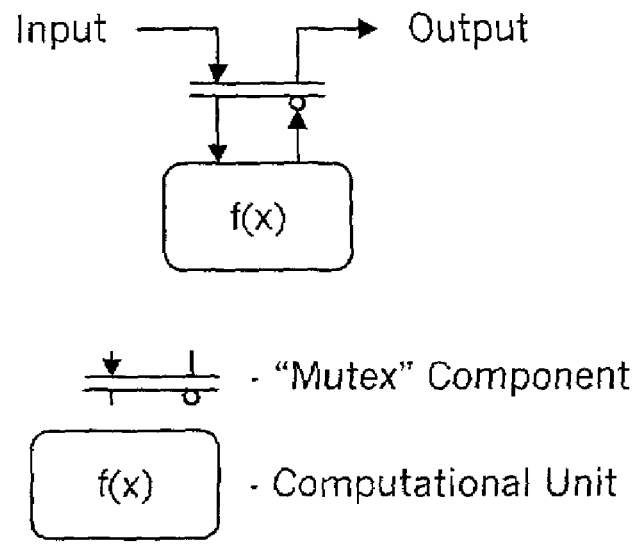
FIG. 43 illustrates locking a Computational Unit with a "Mutex" component

Given the "mutex" component above, any section of a dataflow graph may be locked to a single data value as shown in FIG. 43.

The issues involved in implementing loops highlight a more general concern when implementing traditionally sequential processes in a parallel execution environment: ensuring that certain operations are performed in the appropriate order. For example, when a memory read is supposed to be performed after a memory write, how is this dependency expressed? For this reason, "memory-write" operators typically have an output stream of "void" data type, to indicate the completion of a write. Furthermore, there are purely control-oriented components available, such as the "pacer" and "mutex" components, to ensure that the proper sequence is maintained.

High-Level Control

The almost physical presence of data when using DFC protocols, along with the ability of the "void" data type to explicitly describe control structures, allows any general state machine to be constructed from DFC components. Such a state machine may start with "void" data present in its initial state, at the input to a particular component. Various "auto-merge" and "route" components may then be used to control the movement of the state "token" to other positions within the structure. While this technique is overkill for simple state machines, it becomes extremely useful in the context of controlling high-level computational structures.

Figure 44:
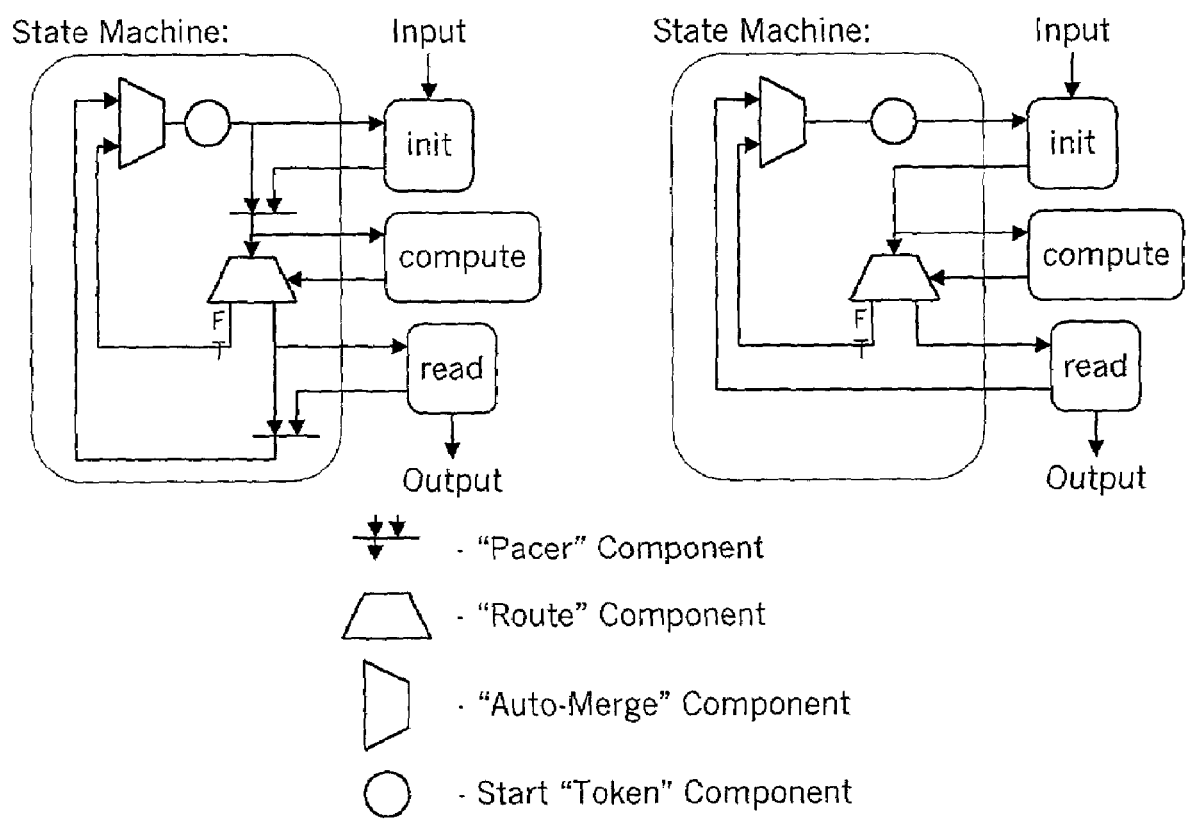
FIG. 44 illustrates an explicit state machine used to control a process

As an example, consider the implementation of such a state machine where the individual states are:
Initialize a block of memory given an input
Perform a computation within the memory which returns a boolean result
If the result is true, read the block of memory and pass its results on
If the result is false, discard the memory data Once the "init", "compute", and "read" operations are constructed to be triggered via "void" data tokens and to report completion tokens, they may be controlled by a state machine whose state token is fanned out to trigger processes and paced and routed by the completion signals of these processes. FIG. 44 shows an example implementation of such a state machine on the left. This figure introduces the "token" component, which contains a single valid piece of data at startup, despite the fact that it does not receive an input first. The "token" component can be extended to contain multiple pieces of valid data at startup, each with its own data value, if so desired. A simpler implementation of the state machine is shown on the right, where the operational units take more of an active role, consuming the state tokens and producing new ones.

While the state machine implementation shown in the right half of FIG. 44 seems simpler, the technique of implementation in the left half has some advantages. Both implementations could be detached right at the start "token" component, so that the signal previously driven by the "token" component is instead driven by an outside stimulus, and the output of the "auto-merge" component becomes the resulting output of the state machine. With such a modification, the structure becomes an even larger "macro" state which can be incorporated in a larger state machine. The implementation in the left half of the figure could be upgraded, however, such that the control path no longer uses "void" tokens, but tokens with an appropriate value. This value can be fed to modified "init", "compute", and "read" operations as, for instance, the offset within memory at which to perform this operation. After such an alteration, the structure can then be used in a parallel manner, where each operation is working with a different section of memory. This may substantially improve the throughput of the structure versus the original "single-threaded" state machine.

To take full advantage of such a modification, a control unit is required that will keep track of the availability of the various sections of memory. The unit may feed available memory offsets to the control input whenever it is able, and then must retrieve these offsets from the control output to feed them back in. For small numbers of available memory sections, this control unit may be as simple as the expanded "token" component described earlier, where the unit has, buffered within it at start-up, the memory spaces available for computations. It feeds these out and then passes on whatever comes back to its input. The resulting "multi-threaded" structure then looks exactly as shown in the left half of, except with the understanding that the start "token" component actually contains many tokens which have actual values to be passed to the operational units as memory offsets. Because of the origins of such a component, it is referred to as a "token controller".

When the number of start tokens is large, the above technique may not be efficient, as it would require a large FIFO that was initializable upon reset. This problem may be surmountable through the use of explicit initialization circuitry and external memory used for storage. Simplifications may be had if the values of the tokens are easily derivable via a one-to-one mapping to a contiguous range of integers, where the integers themselves could refer to bits in a large bit mask stored in a memory. A bit from the mask would then be cleared and its corresponding integer converted into the token value to feed to the state machine, and returning values from the state machine could be converted back to the corresponding integer, which in turn is used to set a bit in the bit mask. Additional circuitry would have to be employed to search the bit mask for available tokens.

An even greater simplification may be had if the state machine structure is a linear process, always returning tokens in the same order in which they were received. In such a case, the control unit is virtually identical to that used for memory-based FIFOs. What used to be the "head" pointer of the FIFO becomes the integer to be converted to the input token of the state machine. This integer is incremented, such as in a FIFO "push" operation, whenever one is available (the FIFO is not full) and the result can be fed to the state machine. Values returning from the state machine are required to correspond to the "tail" pointer, which they will, so long as the process is linear, and are returned to the control unit in a manner similar to a FIFO "pull" operation.

Pointers

The state machine described above implies a technique useful in dataflow computations and similar to the "pass-by-reference" technique of programming languages. Just as passing arrays to functions in the C programming language is really implemented by passing a pointer to that array, passing arrays in a dataflow structure can be implemented by simply passing a pointer to the beginning of the array. One issue is the ability to accurately track the lifetime of the array in a manner that allows memory space to be recycled for use in future computations. Doing so typically requires explicit user declarations for when a memory space should be allocated or deallocated. Depending on the flexibility required, the recycling of memory spaces may either be as simple as that described in the previous section, or it may be extremely complex, requiring the hardware equivalent of C's "malloc" and "free" functions.

Figure 45:
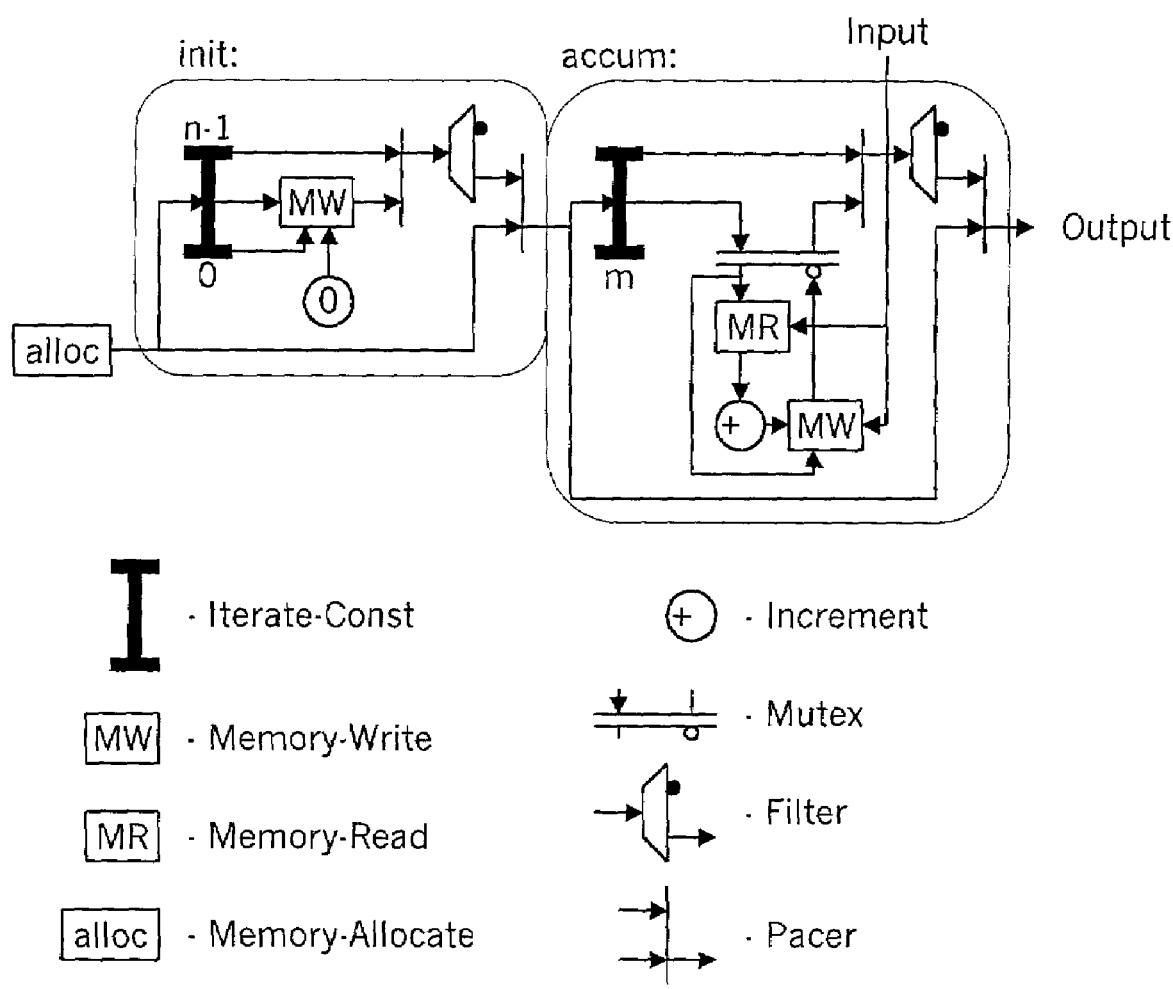
FIG. 45 illustrates a "Histogram" Computational Unit

As an example, consider a simple implementation of pointers, as applied to a "histogram" operator. The result of a "histogram" operation on an input image could be a sequence of values representing the accumulated number of pixels at each possible pixel value, but this may be cumbersome if the downstream component wishes to access the results in a random pattern. Therefore, it is more appropriate for the result to be an address within a particular memory, in which the results are stored in an understood fashion. Thus, to begin a "histogram" operation, an appropriate amount of memory space needs to be allocated and initialized to zero. The incoming pixel values are then used to increment the appropriate accumulation in memory. Once the agreed upon number of pixels has been accumulated, the memory image of the histogram is complete, and the pointer to the beginning of the results can be passed out as the result. FIG. 45 shows an overview of the implementation of the "histogram" operation using many of the components previously described.

An "alloc" block, as shown in FIG. 45, can be the output from a simple token controller, as described previously herein. Further downstream, the last component to use the histogram results would consist of a "free" block, which would be the input side of the token controller. Therefore, the data type of the busses carrying the memory offset must have an unambiguous relationship to the controller that created the value, such as an attribute denoting the controller. Furthermore, the value of the offset can not be modified and still keep this same attribute.

Such an implementation of memory allocation still has the complications associated with its equivalent in programming languages: memory leaks when an offset isn't passed to "free", and controller corruption when the same offset is inappropriately passed to "free" more than once. When a simple memory controller, such as a token controller, is used to track memory allocation, memory leaks will eventually discard all valid tokens leaving none available for allocation and the process will halt. Inappropriately passing a token to "free" more than once will allow it to be simultaneously allocated more than once, and could eventually clog the loop from the "alloc" to the "free" blocks.

Applications of Dataflow Protocols

1. Circuit Methodology

DFC/pDFC Theory

Methodology for Assembling Computational Operators

A series of parameterized transformations can describe the proper method for connecting computational elements using the flow-control protocols of dataflow components (DFC) as disclosed herein. By maintaining parameters that describe the flow-control protocols used at a particular point in the computation, the data stream may be translated into any other desired protocol using the proper set of simple transformations. This provides accommodations for hardware and other environmental restrictions such as a set number of memory connections or an upper bound on interconnection throughput.

Control Correct by Assembly

Because the DFC transformations assure that data is not lost or fabricated, a given computation is subsequently guaranteed to function exactly as described. The function may be designed at a level of abstraction above the actual hardware implementation, allowing the programmer to focus solely on the desired computation while ensuring that the underlying result will behave properly. Since the control protocols are programmatically created, the programmer need not be concerned about the details and has no opportunity to implement the control incorrectly.

Distributed Control

The transformations available to DFC components allow the data flow to be paused without the need for a high-level controller, which could become overly-complicated as the specified computation evolved into the desired result. In contrast, the transformations rely on simple, localized hardware elements, each of which need only manipulate a portion of data flowing through the complete computational graph.

Synchronized Data Protocol

By properly maintaining parameters which describe the data flow through a series of pipelined components (e.g., skew), several pipelined computational elements may be connected together. Reconvergent fanout of data may be accommodated so as to automatically generate a functionally correct design. Furthermore, translations between the "synchronized data" protocol and the DFC protocols may be achieved in a manner which is guaranteed to function properly. While having no flow control itself, the "synchronized data" protocol has the advantage of requiring near-zero hardware overhead to implement simple computations and offers the ability of being translated back into a suitable flow-control protocol when necessary.

Memory FIFO Protocol

Some computations operate on an extreme amount of input data which may need to be accessed randomly and repeatedly, rather than sequentially. With such computations, it is inappropriate to stream data from one computational element to the next, as each unit would need to buffer up the entire data set before performing its calculations. The memory-FIFO protocol is layered on top of the standard dataflow protocols so as to alleviate these inefficiencies. Data sets stay in one place in memory while a pointer indicating the offset into that memory is passed from one computation to the next using standard flow control. Recycling of memory space is achieved with a memory-FIFO controller.

Circuit Modelling

Component Modelling

Components in typical schematic capture schemes have fixed port maps. They have a specific number of ports, with specific names and specific types. According to the invention, components have non-static dynamic port maps that can add and remove ports in response to user actions. Such components are part of a system according to the invention designated COREFIRE™.

Ports in typical, conventional schematic capture schemes have fixed types. Components in the system according to the invention support classes of port interfaces. For instance, according to the invention using the protocols discussed herein, an adder can be defined that has two inputs called A and B and one output called SUM. A, B and SUM can adapt to become any bit width of any supported type. For instance, A could be an 8-bit unsiged integer, B could be a 32-bit IEEE float, and SUM could be a 24-bit signed integer.

Conventional examples of programmatic structural assembly of digital circuits, for example JHDL, create structural models of hardware at object creation time. The system according to the invention separates object creation from rendering to hardware. This allows the parameters of an existing circuit to be modified after it is created. One example of such variation is adjustment of bit width.

According to the Invention, Components can be Generated Using the Protocols Disclosed Herein to Adapt Based on Whether Their Ports are Used or Not.

Statically port mapped circuit models require that all of their input ports be connected in some functionally correct manner. According to the invention, dynamic port maps allow certain ports to be optional. The ENABLE and RESET ports of a flip-flop, for instance, may simply be removed at rendering time if they are unconnected.

Typical conventional schematic capture schemes provide libraries of components with fixed parameterization. For instance, if a circuit contains an 8-bit adder and a 16-bit adder is desired, the 8-bit adder must be removed and a 16-bit adder put in its place. According to the invention, using protocols disclosed herein, components can adapt based on their interconnection with other components. For example, according to the invention, components may derive parameters like their bit width based on their interconnection with other components. Indeed, it is possible to reconfigure the bit width of a design by simply changing it in one place and allowing the circuit to adapt to the new situation. Moreover, in addition to deriving their parameterizations from their interconnection with other components, some components must be set to fixed bit widths or other parameters. According to the invention, the components can be configured to override the adaptive propagation mechanism and mandate certain parameterizations.

According to the invention components can also be configured with the protocols to adjust port maps as needed. An adder, for example, has several inherent constraints on its port map. A typical adder has A, B and SUM ports. All three start off with an unknown type. If the user connects an 8-bit unsigned integer to the A port, the component can make certain inferences about its remaining ports. It knows, for instance, that it's output port must be at least 9 bits. If a 9-bit unsigned integer is connected to the SUM port, the component knows further that is can only accept unsigned inputs of 8-bits or less on the B port.

Components according to the invention have LAD interfaces to the host system. Such components provide information to the host at runtime reporting the component's version of its well-known interface and its location in the LAD address space. This allows a runtime host application to determine the interfaces available in a programmed processing element.

Components according to the invention can also report their resource requirements at construction time. These resource requirements can be used to monitor circuit size dynamically at design time. This provides the user with immediate feedback to their design decisions.

Typical conventional schematic capture systems have flat port structures. Ports of components according to the invention can be configured to contain arbitrary hierarchy. In this way, ports can be created that support multi-signal connections with arbitrary directionality.

Component Implementations

According to the inventive data flow components (DFC) and computational components can be implemented. An exemplary list of DFC related components includes:

ClearSkew
ClearSkew is a circuit structure implementing a DFC transform that converts a PDR or VDR stream that may or may not have skew to a VDR stream with no skew.

PushCast
PushCast is a circuit structure implementing a DFC transform from VDR to PDR.

AddSkew
AddSkew is a circuit structure implementing a DFC transform that adds skew to a stream. Typically, it is used to alleviate timing problems during place and route.

Sync
Sync is a circuit structure that combines two DFC streams into one synchronized two-element DFC stream.

Valve
The Valve component is a DFC component with an LAD host interface. It is primarily a debugging tool. It allows a certain amount of data to pass through, then pauses for interaction with a host computer. Valve can be used to provide host-observability into the computational process.

FPDP to DFC Protocol Converter
Provides functional conversion from FPDP protocol to PDR protocol.

WSDP to DFC Protocol Converter
Provides functional conversion from WSDP protocol to PDR protocol.

MyriNet to DFC Protocol Converter
Provides functional conversion from MyriNet protocol to PDR protocol.

A/D to DFC Protocol Converter
Provides functional conversion from analog signaling to PDR protocol.

Unidirectional PE-to-PE DFC Connections Implemented with Scarce Interconnect
PDR-based component that allows data to move between processing elements in one direction.

Bidirectional PE-to-PE DFC Connections Implemented with Scarce Interconnect
PDR-based component that allows data to move across between processing elements in both directions.

PDR to Memory Protocol Converter
Components that source or sink PDR streams to or from memories.

DMA to DFC Protocol Converter
Components that source or sink PDR streams to or from the host using DMA.

Computational Components Include:

FFT
FFT cores can be adapted to appear as standard dataflow components using a modified form of the memory-FIFO protocol. Incoming data is retired to FFT memory and a 'pointer' to that memory is then passed to the FFT control circuitry. When the FFT operation is complete, that same 'pointer' is then passed to a memory-fetch unit which reads out the results and passes them on to the next computation. Modifications to the memory-FIFO protocol involve an additional level of control to guarantee that the memory crossbar is not switched at inappropriate times.

Image Processing Window
The Window operator takes a PDR-stream containing a rasterized image and provides a output PDR-stream containing a parallel sliding window view of the image. This allows operations that work on windows, like edge detection, to take a raster image as input and thus minimize their memory overhead.

Variable Priority Encoder Using Carry Logic
The primitive carry-logic elements found within FPGAs may be used to implement priority encoding. By remembering previous encoder results and feeding them back into the carry logic, the priority encoder may be modified to implement a variable priority scheme. This variable priority can be far more fair in terms of its acknowledgment of many outstanding requests, while still maintaining the maximum theoretical throughput of the fixed priority encoder.

The above lists of DFC and computational components according to the invention are illustrative. Other useful components can be formed using the protocols disclosed herein.

Connection Modeling
Typical schematic capture systems model connections between the ports of components as simple wires. According to the invention connections between components allow components to discover the types of ports they are connected to and adapt accordingly.

According to the invention, connections can imply complex glue logic. DFC connections are more complex than simple wires. Fanout of a DFC connection, for instance, requires some glue logic to accommodate reconvergence of READY signals. This logic need not be explicitly represented by the user, but may be inferred at build time based on the connection for the protocol.

Application Development Methodology

According to the invention, designs are portable, and are not dependent on the resources of a particular hardware platform or architecture. Designs are created as a hierarchy of "Diagrams"—a Diagram is a collection of primitive intelligent components implementing the protocols disclosed herein, data sources and sinks, and other Diagrams. A Diagram is a reusable design element that is targeted to a specific hardware platform during a separate resource binding stage that is independent of design construction.

The Diagrams which comprise a design contain no hardware platform specific information. Therefore, each Diagram may be reused by including it in other designs.

A design is targeted to a specific hardware platform by binding the data sources and sinks contained in the design Diagrams to data sources and sinks provided by a selected hardware platform. A design may be retargeted to a different hardware platform by changing the bindings of its data sources and sinks.

According to the invention components may be parameterized explicitly by a user via a design editor, or automatically via type propagation mechanism. The Type Propagation mechanism, and automatic adaptation of components within a design are useful to maintaining the reusability of such designs. When a connection is made between a port with a specified data type, and a port with an unspecified data type, the port with the unspecified data type may determine its type from the type of the port it is connected to. For example, if a component has a 32 bit signed integer output, and that output is connected to an unspecified input of another component, the type propagation mechanism can set the input port to 32 bit signed integer type.

The type propagation mechanism allows components to adapt when they are inserted into a circuit. In addition, according to the invention components may use type changes that are propagated onto one of their ports to set the types of their other ports. This will cause further type propagation waves through the circuit.

According to the invention design components can be automatically re-used to minimize the amount of logic needed to instantiate a design. Reuse may be applied to both platform resources and computational operations. For example, when a memory resource is used by multiple design components, multiplexers may be automatically inserted to effect multiple use of the memory. Likewise, computational resources (a multiplier, for example) may be reused by automatic insertion of multiplexing hardware. Such automatic time multiplexing of computational operations may be implemented using software.

Application Debugging

Processing element designs produced using techniques, components and connections according to the invention can contain a LAD interface at a well-known location that provides information about the other LAD interfaces present in the system. This interface may consist of a memory element containing the interface name, version and LAD offset of each interface present in the design. Host software could interface with a design and provide an automatically generated graphical user interface to the processing element.

The presence of PLLs, DLLs and pipelined memories in high-performance FPGA architectures make it very difficult to perform traditional single-step debugging of hardware designs. Using specialized DFC components, a form of single-step debugging at full clock rates is possible. According to the invention, Valve components can be placed throughout a circuit. These Valve components can be programmed by a host computer to allow a certain number of pushes to propagate through them. The Valves can store the data values that passed through them. When the predefined number of pushes has past, the Valve asserts that it is not ready and waits for interaction from the host. The host can query the Valve to see the data that passed through and prompt it to allow more data through. Valves can also be used to bypass portions of the design by allowing the host to directly insert data in the stream. This would, for instance, allow testing of the computational portion of a design without have to use external test fixtures to source data through the I/O portion of a design.

What is claimed is:

1. A method of modeling a dataflow architecture in a network, comprising the steps of:
    storing in a memory indicia representative of a dataflow architecture having a plurality of interconnected components with inputs and outputs responsive to intercommunication protocols; and
    processing conversions among the intercommunication protocols to determine control structures for each connection required to implement said dataflow architecture,
    wherein the conversions are executed until the intercommunication protocols for each of the control structures matches the intercommunication protocols at the inputs or outputs of the interconnected components,
    wherein the indicia stored in said memory and the control structures are translated into a description of an implementation of said dataflow architecture, and the description of an implementation is further translated into a physical implementation of the dataflow architecture.

2. A method as recited in claim 1, where the description of an implementation is an electronic data interchange format (EDIF) netlisting language.

3. A method as recited in claim 1, where the description of an implementation is structural very highscale integrated circuit description layer (VHDL).

4. A method as recited in claim 1, where the description of an implementation is structural Verilog.

5. A method as recited in claim 1, wherein the physical implementation is configuration data for a field programmable gate array (FPGA).

6. A method as recited in claim 1, wherein the physical implementation is a layout for an Application Specific Integrated Circuit (ASIC).

7. A method as recited in claim 1, wherein the physical implementation is object code for a general-purpose processor.

8. A method as recited in claim 1, wherein the intercommunications protocols comprise at least one of a VDL (valid data pull) protocol, a VDR (valid data ready) protocol, a PDR (push data ready) protocol a DX (data restricted ready) protocol; and a PDX (push data restricted ready) protocol.

9. A method as recited in claim 8, comprising at least one of a Clearskew conversion, a PullCast conversion, a PushCast conversion, a Synchronize conversion, a GetPush conversion, an AddSkew conversion.

10. A method as recited in claim 9 wherein:
    said Pull Cart conversion propagates the data and valid signals of a VDL protocol stream as the respective data and valid signals of the VDR protocol and the pull signal of the VDL protocol as the result of a logical AND operation of the valid signal of the VDL protocol and the ready signal of the VDR protocol;
    said Push Cart conversion propagates the data signal of a VDR protocol stream as the data signal of the PDR protocol, the push signal of the PDR protocol as the result of a logical AND operation of the valid signal of the VDR protocol and the ready signal of the PDR protocol delayed by the skew, and the ready signal of the PDR protocol is propagated as the ready signal of the VDR protocol;

said Clear Skew conversion comprises pushing a value of a data signal of a PDR protocol into a first-in-first-out FIFO data storage mechanism, whenever a push signal of the PDR protocol is asserted;

basing a ready signal of the PDR protocol on the number of data values stored in the FIFO, such that if a maximum number of values that the FIFO can store less a number of currently stored values is less than a skew of the PDR protocol, the ready signal of the PDR protocol is asserted;

pulling a value of the data signal of a VDL protocol from the FIFO, whenever the pull of the VDL protocol signal is asserted;

asserting the valid signal of the VDL protocol whenever there are data values stored in the FIFO;

said Synchronize conversion comprises propagating a data signal of the VDL protocol to a data signal of the DX protocol;

feeding a valid signal of the VDL protocol to a global, many-input, logical AND operation associated with a domain of the DX protocol;

driving a pull signal of the VDL protocol with an output of the global, many-input logical AND operation;

said GetPush conversion comprises propagating a "data" signal of the DX protocol to a "data" signal of the PDR protocol;

feeding the "ready" signal of the PDR protocol to a global, many-input, logical AND operation associated with a domain of the DX protocol;

driving a "push" signal of the PDR protocol with an output of the global, many-input logical AND operation, delayed by a skew of the PDR protocol;

said Skew conversion comprises propagating an original data signal of the protocol to a final data signal through a component with fixed delay;

propagating an original push or valid signal of the protocol, if one exists, to a final push or valid signal through a component with fixed delay equivalent to that used to propagate the "data" signal; propagating an original pull or ready signal of the protocol, if one exists, to a final pull or ready signal through a component with fixed delay; and the difference in skew between the original and final signals being equivalent to a sum of the delay for the data signal and the delay for the ready or pull signal.

11. A method as recited in claim 1, wherein:

said component defines a transformation of values present at the input ports of the component to values at output ports of the component;

characteristic properties associated with instances of the component influence behavior of the dataflow architecture; and an algorithm for creating a description of an implementation of a said component is based on the properties of that component, the properties of the ports associated with that component, and interconnection of the ports of that component with the ports of another component.

12. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein one of the intercommunications protocols is a VDL (valid data pull) protocol comprising:

a data signal and a valid signal, wherein the valid signal indicates that the data on the data signal is valid; and a pull signal which propagates in a direction opposite to a direction of propagation of the data signal and the valid signal and wherein the pull signal indicates that data on the data signal has been consumed, wherein the pull signal may reference values of the data signal and the valid signal separated from it by a fixed amount of time, said time being a skew.

13. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein one of intercommunications protocols, is a VDR (valid data ready) protocol comprising:

a data signal and a valid signal, wherein the valid signal indicates that data on the data signal is valid; and a ready signal which propagates in a direction opposite to a direction of propagation of the data and valid signals and which indicates that data on the data signal which has been indicated as valid by the valid signal will be consumed, wherein the ready signal may reference values of the data and valid signals separated from it by some fixed amount of time, said time being a skew.

14. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein one of the intercommunications protocols is a PDR (push data ready) protocol comprising:

a data signal and a push signal, wherein the push signal indicates that data on the "data" signal must be consumed; and a ready signal which propagates in a direction opposite to a direction of propagation of the data signal and the push signal and which indicates that the data on the data signal may be signaled as pushed data by the push signal, wherein the ready signal may reference values of the data and push signals separated from it by some fixed amount of time, said time being a skew.

15. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein one of the intercommunications protocols is a DX (data restricted ready) protocol comprising:

a data signal; and an associated domain for which values on any two data signals associated with the same domain are separated from one another by a fixed amount of time, said time being a skew.

16. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein the intercommunications protocols comprise at least one of a VDL (valid data pull) protocol, a VDR (valid data ready) protocol, a PDR (push data ready) protocol a DX (data restricted ready) protocol; and a PDX (rush data restricted ready) protocol, and wherein one of the conversions among intercommunications protocols is a PullCast conversion, comprising a conversion from a dataflow stream using the VDL protocol with a skew of zero and producing a dataflow stream using the VDR protocol with a skew of zero.

17. A method as recited in claim 16, wherein the PullCast conversion is implemented by propagating the data and valid signals of a VDL protocol stream as the respective data and valid signals of the VDR protocol and the pull signal of the VDL protocol as the result of a logical AND operation of the valid signal of the VDL protocol and the ready signal of the VDR protocol.

18. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein the intercommunications protocols comprise at least one of a VDL (valid data pull) protocol, a VDR (valid data ready) protocol, a PDR (gush data ready) protocol a DX (data restricted ready) protocol; and a PDX (push data restricted ready) protocol, and wherein one of the conversions among intercommunications protocols is a PushCast conversion comprising a conversion from a dataflow stream using the VDR protocol with a particular skew and producing a dataflow stream using the PDR protocol with a same skew.

19. A method as recited in claim 18, wherein the PushCast conversion is implemented by propagating the data signal of a VDR protocol stream as the data signal of the PDR protocol, the push signal of the PDR protocol as the result of a logical AND operation of the valid signal of the VDR protocol and the ready signal of the PDR protocol delayed by the skew, and the ready signal of the PDR protocol is propagated as the ready signal of the VDR protocol.

20. A method of modeling a dataflow architecture in a network, comprising the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, wherein the intercommunications protocols comprise at least one of a VDL (valid data pull) protocol, a VDR (valid data ready) protocol, a PDR (push data ready) protocol a DX (data restricted ready) protocol; and a PDX (push data restricted ready) protocol, and wherein one of the conversions among intercommunications protocols is a ClearSkew conversion comprising a conversion from a dataflow stream using a first protocol with a particular skew and producing a dataflow stream using a different protocol with zero skew.

21. A method as recited in claim 20, wherein the implementation of the ClearSkew comprises:
pushing a value of a data signal of a PDR protocol into a first-in-first-out FIFO data storage mechanism, whenever a push signal of the PDR protocol is asserted;
basing a ready signal of the PDR protocol on the number of data values stored in the FIFO, such that if a maximum number of values that the FIFO can store less a number of currently stored values is less than a skew of the PDR protocol, the ready signal of the PDR protocol is asserted;
pulling a value of the data signal of a VDL protocol from the FIFO, whenever the pull of the VDL protocol signal is asserted; and
asserting the valid signal of the VDL protocol whenever there are data values stored in the FIFO.

22. A method of modeling a dataflow architecture in a network, comprising the steps of:
storing in a memory indicia representative of a dataflow architecture having a plurality of interconnected components with inputs and outputs responsive to intercommunication protocols; and
processing conversions among the intercommunication protocols to determine control structures for each connection required to implement said dataflow architecture,
wherein the conversions are executed until the intercommunication protocols for each of the control structures matches the intercommunication protocols at the inputs or outputs of the interconnected components,
wherein the indicia stored in said memory and the control structures are translated into a description of an implementation of said dataflow architecture,
wherein the intercommunications protocols comprise at least one of a VDL (valid data pull) protocol, a VDR (valid data ready) protocol, a PDR (gush data ready) protocol a DX (data restricted ready) protocol; and a PDX (push data restricted ready) protocol, and
wherein one of the conversions among intercommunications protocols is a Synchronize conversion comprising a conversion from a dataflow stream using the VDL protocol with a skew of zero and producing a dataflow stream using the DX protocol with zero skew.

23. A method as recited in claim 22, wherein the implementation of the Synchronize conversion comprises:
propagating a data signal of the VDL protocol to a data signal of the DX protocol;
feeding a valid signal of the VDL protocol to a global, many-input, logical AND operation associated with a domain of the DX protocol; and
driving a pull signal of the VDL protocol with an output of the global, many-input logical AND operation.

24. A method of modeling a dataflow architecture in a network, comprising the steps of:
storing in a memory indicia representative of a dataflow architecture having a plurality of interconnected components with inputs and outputs responsive to intercommunication protocols; and
processing conversions among the intercommunication protocols to determine control structures for each connection required to implement said dataflow architecture,
wherein the conversions are executed until the intercommunication protocols for each of the control structures matches the intercommunication protocols at the inputs or outputs of the interconnected components,
wherein the indicia stored in said memory and the control structures are translated into a description of an implementation of said dataflow architecture, and
wherein the intercommunications protocols comprise at least one of a VDL (valid data pull) protocol, a VDR (valid data ready) protocol, a PDR (gush data ready) protocol a DX (data restricted ready) protocol; and a PDX (push data restricted ready) protocol, and
wherein one of the conversions among intercommunications protocols is a GetPush conversion comprising a conversion from a dataflow stream using the DX protocol with a particular skew and producing a dataflow stream using the PDR protocol with the same skew as the particular skew.

25. A method as recited in claim 24, wherein the implementation of the GetPush conversion comprises:
propagating a "data" signal of the DX protocol to a "data" signal of the PDR protocol;
feeding the "ready" signal of the PDR protocol to a global, many-input, logical AND operation associated with a domain of the DX protocol; and
driving a "push" signal of the PDR protocol with an output of the global, many-input logical AND operation, delayed by a skew of the PDR protocol.

26. A method of modeling a dataflow architecture in a network, comprising the steps of:
storing in a memory indicia representative of a dataflow architecture having a plurality of interconnected components with inputs and outputs responsive to intercommunication protocols; and
processing conversions among the intercommunication protocols to determine control structures for each connection required to implement said dataflow architecture,
wherein the conversions are executed until the intercommunication protocols for each of the control structures matches the intercommunication protocols at the inputs or outputs of the interconnected components,
wherein the indicia stored in said memory and the control structures are translated into a description of an implementation of said dataflow architecture,
wherein the intercommunications protocols comprise at least one of a VDL (valid data pull) protocol, a VDR (valid data ready) protocol, a PDR (rush data ready) protocol a DX (data restricted ready) protocol; and a PDX (push data restricted ready) protocol, and
wherein one of the conversions among protocols is an AddSkew conversion comprising a conversion from a dataflow stream using a particular protocol with a particular skew and producing a dataflow stream with the same protocol and a larger skew than the particular skew.

27. A method as recited in claim 26, wherein the implementation of the AddSkew conversion comprises:
propagating an original data signal of the protocol to a final data signal through a component with fixed delay;
propagating an original push or valid signal of the protocol, if one exists, to a final push or valid signal through a component with fixed delay equivalent to that used to propagate the "data" signal;
propagating an original pull or ready signal of the protocol, if one exists, to a final pull or ready signal through a component with fixed delay; and
the difference in skew between the original and final signals being equivalent to a sum of the delay for the data signal and the delay for the ready or pull signal.

28. A method of modeling a dataflow architecture in a network, comprising the steps of:
- storing in a memory indicia representative of a dataflow architecture having a plurality of interconnected components with inputs and outputs responsive to intercommunication protocols; and
- processing conversions among the intercommunication protocols to determine control structures for each connection required to implement said dataflow architecture,
- wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture;

wherein:
- said component defines a transformation of values present at the input ports of the component to values at output ports of the component;
- characteristic properties associated with instances of the component influence behavior of the dataflow architecture; and
- an algorithm for creating a description of an implementation of a said component is based on the properties of that component, the properties of the ports associated with that component, and interconnection of the ports of that component with the ports of another component, wherein:
- a port associated with a component represents potential interconnections with another component;
- characteristic properties associated with port instances influence behavior of the dataflow architecture; and
- an algorithm for creating a description of an implementation of a said port is based on properties of that port, and interconnection of that port with another port.

29. A method as recited in claim 28, wherein:
- interconnections between the ports represent an ability of the ports to communicate using a common interconnection protocol;
- characteristic properties of interconnection instances influence behavior of the dataflow architecture; and
- an algorithm for creating a complete description of an implementation of a said interconnection is based on properties of the interconnection, and the ports that the interconnection interconnects.

30. A method as recited in claim 28, wherein one of the characteristic properties associated with a port determines the interconnection protocol that must be used by other ports to interact with said port.

31. A method as recited in claim 30, where the description of the implementation of the interconnection protocol associated with the port of a component comprises a data portion and a control portion.

32. A method as recited in claim 31, where resources allocated to the data portion and accuracy of the data portion in a description of a port in a description of the implementation are determined by resources allocated to the data portion and accuracy of the data portion of the ports to which the particular port is connected.

33. A method as recited in claim 32, where sizing of the data portion and the accuracy of the data portion of an intercommunication protocol are dynamically recomputed in response to changes in the resources allocated to the data portion and the accuracy of the data portion of the ports to which the particular port is connected.

34. A method as recited in claim 33, where the intercommunication protocol used to implement the control portion of a port of a particular component is determined by the intercommunication protocols associated with the ports to which said port is connected.

35. A method as recited in claim 34, where the determination of the intercommunication protocol used to implement the control portion of a port of a particular component can be dynamically recomputed in response to changes in the intercommunication protocol used to implement the control portion of the ports to which the particular port is connected.

36. A method as recited in claim 35, where a particular component changes the properties of its ports based on properties of the ports of other components with which the ports of the particular component are associated via interconnections.

37. A method as recited in claim 36, where a particular component may dynamically recomputes the properties of its ports in response to changes in properties of ports of other components with which the ports of the particular component are associated via interconnections.

38. A method as recited in claim 37, where the determination of the resources allocated to the data portion and the accuracy of the data portion of an intercommunication protocol can be made fixed.

39. A method as recited in claim 38, where the intercommunication protocol used to implement the control portion of a port of the particular component can be made fixed.

40. A method as recited in claim 39, where one of the properties of a port determines whether the port must be connected to another port or whether its connection to another port is optional.

41. A method as recited in claim 40, where the description of the implementation of the particular component is determined based on a presence or absence of connections to the optional ports of the component.

42. A method as recited in claim 41, where a component can provide an estimate of resources required to build the component using an algorithm computationally simpler than an algorithm required to build the component.

43. A method as recited in claim 42, where the description of the implementation of an interconnection is based on the ports associated with the interconnection, the properties of said ports, and the properties of the interconnection itself.

44. A method as recited in claim 43, where an abstract representation being translated into indicia comprises a formal language describing instances of the components and the interconnections between the ports of the components.

45. A method as recited in claim 44, where the abstract representation being translated into indicia comprises a graphical depiction of the components and the interconnections between the ports of the components.

46. A method of modeling a processing system comprising the steps of:
- storing in a memory indicia representative of a data flow component responsive to at least a data signal and a forward flowing handshake signal and a backward flowing handshake signal; and
- in a processor simulating a data flow operation of said data flow component, said data flow component being adaptable to processing conversions among intercommunications protocols, comprising simulating a VDR (valid data ready) protocol by executing with said processor programmed steps corresponding to indicia stored in said memory, wherein said data signal is valid only during a time period when said valid signal and a ready signal are asserted simultaneously, wherein simulating said VDR protocol comprises executing programmed steps corresponding to indicia for a program rule stored in said memory wherein said data signal becomes valid at a later time than said valid signal, wherein a said later time corresponds to skew represented by a number of clock cycles.

47. A method as recited in claim 46, wherein said skew is a number of said clock cycles of delay between a time when asserting a ready signal of a selected dataflow component and a time when valid data is present on a data signal of said selected dataflow component.

48. A method as recited in claim 46, further comprising simulating a pipelined computational unit by applying skew to synchronize said valid signal with said data signal.

49. A method as recited in claim 48, wherein said valid signal is delayed in time by a same delay as the delay experienced by said data signal.

50. A method as recited in claim 49, wherein said a simulation of a computation unit introduces said delay experienced by said data signal.

51. A method as recited in claim 50, wherein a delay of said valid signal is introduced by inserting a delay of a fixed number of clock cycles between an input valid signal and an output valid signal of said dataflow component.

52. A method as recited in claim 46, comprising simulating a PDR (push data ready) protocol by executing within said processor programmed steps corresponding to indicia stored in said memory, wherein said dataflow component has a push signal that may be asserted only when said ready signal is asserted.

53. A method of modeling a processing system comprising the steps of:
    storing in a memory indicia representative of a data flow component responsive to at least a data signal and a forward flowing handshake signal and a backward flowing handshake signal; and
    in a processor simulating a data flow operation of said data flow component, said data flow component being adaptable to processing conversions among intercommunications protocols,
    comprising simulating a PDR (push data ready) protocol by executing within said processor programmed steps corresponding to indicia stored in said memory, wherein said dataflow component has a push signal that may be asserted only when said ready signal is asserted, wherein said push signal and said ready signal are not initially asserted in a same clock cycle.

54. A method as recited in claim 53, wherein data appearing on said data signal of said dataflow component when said push signal and said ready signal are asserted must be consumed by a second dataflow component.

55. A method as recited in claim 54, wherein said ready signal is subjected to a delay in time of a number of clock cycles forming a skewed ready signal and a logical AND of said skewed ready signal and said valid signal forms said push signal.

56. A method as recited in claim 55, wherein said dataflow component is simulated to have a input valid signal, an input data signal, an output data signal, a common input ready signal and output ready signal and an output push signal, said push signal being a logical AND of said skewed ready signal and said input valid signal.

57. A method of modeling a processing system comprising the steps of:
    storing in a memory indicia representative of a data flow component responsive to at least a data signal and a forward flowing handshake signal and a backward flowing handshake signal; and
    in a processor simulating a data flow operation of said data flow component, said data flow component being adaptable to processing conversions among intercommunications protocols
    wherein a ready signal of said dataflow component is subjected to a delay in time of a number of clock cycles forming a skewed ready signal and a logical AND of said skewed ready signal and a valid signal forms said pull signal.

58. A method as recited in claim 57, wherein said dataflow component is simulated to have a common input valid signal and output valid signal, an input data signal, an output data signal, an input ready signal and an output pull signal, said pull signal being a logical AND of said skewed ready signal and said common input valid signal and output valid signal.

59. A method of modeling a processing system comprising the steps of:
    storing in a memory indicia representative of a data flow component responsive to at least a data signal and a forward flowing handshake signal and a backward flowing handshake signal; and
    in a processor simulating a data flow operation of said data flow component, said data flow component being adaptable to processing conversions among intercommunications protocols
    wherein skew accumulates, and said skew accumulated is cleared by setting a reserve of memory space in a first-in-first-out memory and asserting an almost full signal when memory space available in said first-in-first-out memory is equal to or less than said reserve.

60. A method as recited in claim 59, wherein said reserve is set to the skew of incoming PDR (push data ready) signals.

61. A method as recited in claim 60, wherein said first-in-first-out memory supplies data to a part of a dataflow component connected at a location downstream of said first-in-first-out memory.

62. A method of modeling a processing system comprising the steps of:
    storing in a memory indicia representative of a data flow component responsive to at least a data signal and a forward flowing handshake signal and a backward flowing handshake signal; and
    in a processor simulating a data flow operation of said data flow component, said data flow component being adaptable to processing conversions among intercommunications protocols,
    comprising simulating, by executing in a processor programmed with steps corresponding to indicia stored in said memory, a fanout operator for routing data from an output port of a dataflow component to input ports of a plurality of dataflow components, said fanout operator determining when all of said plurality of dataflow components are ready to accept data by performing a logical AND and subsequently asserting a push signal.

63. A method of modeling a processing system comprising the steps of:
    storing in a memory indicia representative of a data flow component responsive to at least a data signal and a forward flowing handshake signal and a backward flowing handshake signal; and in a processor simulating a data flow operation of said data flow component, said data flow component being adaptable to processing conversions among intercommunications protocols, comprising simulating, by executing in a processor programmed with steps corresponding to indicia stored in said memory, a synchronize operator forming a logical AND of all valid and ready signals to generate all push and pull signals, wherein a plurality of valid inputs to particular dataflow components having a plurality of dataflow inputs are combined to allow said components push and pull outputs to be produced by said plurality of dataflow components only during times when all of said plurality of valid inputs are asserted.

64. A method as recited in claim 63, wherein said push and pull outputs are produced depending upon assertion of a plurality of ready signals.

65. A method of modeling a processing system comprising the steps of:

storing in a memory indicia representative of a data flow component responsive to at least a data signal and a forward flowing handshake signal and a backward flowing handshake signal; and in a processor simulating a data flow operation of said data flow component, said data flow component being adaptable to processing conversions among intercommunications protocols, comprising simulating, by executing in a processor programmed with steps corresponding to indicia stored in said memory, a DX protocol, wherein multiple inputs belong to a same push domain and data consumption at inputs of said operator is synchronized with a static delay element.

66. A method as recited in claim 65, wherein a DX (data restricted ready) bus belongs to a push domain directly related to an operation generating original DX signals.

67. A method as recited in claim 66, wherein a ready output of a dataflow component in said DX protocol is a logical AND of all ready inputs of said components.

68. An apparatus for modeling a circuit, said apparatus comprising:

a memory; and a processor for performing the steps of:

storing in said memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, and the description of an implementation is further translated into a physical implementation of the dataflow architecture.

69. An apparatus for modeling a circuit, said apparatus comprising:

a memory: and a processor performing the steps of:

storing in said memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, and the description of an implementation is further translated into a physical implementation of the dataflow architecture.

70. A circuit having a hardware implementation resulting from modeling a dataflow architecture, wherein the modeling comprises the steps of:

storing in a memory indicia representative of a dataflow architecture having a plurality of interconnected components with inputs and outputs responsive to intercommunication protocols; and processing conversions among the intercommunication protocols to determine control structures for each connection required to implement said dataflow architecture, wherein the conversions are executed until the intercommunication protocols for each of the control structures matches the intercommunication protocols at the inputs or outputs of the interconnected components, wherein the indicia stored in said memory and the control structures are translated into a description of an implementation of said dataflow architecture, and the description of an implementation is further translated into a physical implementation of the dataflow architecture.

71. A circuit having a hardware implementation resulting from modeling a dataflow architecture, wherein the modeling comprises the steps of:

storing in a memory indicia representative of a data flow component responsive to at least a data signal and a forward flowing handshake signal and a backward flowing handshake signal; and in a processor simulating a data flow operation of said data flow component, said data flow component being adaptable to processing conversions among intercommunications protocols, wherein the indicia stored in said memory and the control structures are translated into a description of an implementation of said dataflow architecture, and the description of an implementation is further translated into a physical implementation of the dataflow architecture.

* * * * *

UNITED STATES PATENT AND TRADEMARK OFFICE
CERTIFICATE OF CORRECTION

| | | |
|---|---|---|
| PATENT NO. | : 7,509,647 B2 | Page 1 of 1 |
| APPLICATION NO. | : 10/152634 | |
| DATED | : March 24, 2009 | |
| INVENTOR(S) | : Donaldson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1330 days.

Signed and Sealed this

Seventh Day of September, 2010

David J. Kappos
*Director of the United States Patent and Trademark Office*